(12) United States Patent
Oh et al.

(10) Patent No.: US 12,376,532 B2
(45) Date of Patent: Aug. 5, 2025

(54) LIGHT SOURCE FOR PLANT CULTIVATION AND METHOD OF PLANT CULTIVATION USING THEREOF

(71) Applicants: CHUNGBUK NATIONAL UNIVERSITY INDUSTRY-ACADEMIC COOPERATION FOUNDATION, Chungcheongbuk-do (KR); SEOUL VIOSYS CO., LTD., Gyeonggi-do (KR)

(72) Inventors: Myung Min Oh, Seoul (KR); Da-seul Choi, Chungcheongbuk-do (KR)

(73) Assignees: Chungbuk National University Industry-Academic Cooperation Foundation, Chungcheongbuk-do (KR); Seoul Viosys Co., Ltd., Gyeonggi-do (KR)

( * ) Notice: Subject to any disclaimer, the term of this patent is extended or adjusted under 35 U.S.C. 154(b) by 56 days.

(21) Appl. No.: 17/219,367

(22) Filed: Mar. 31, 2021

(65) Prior Publication Data
US 2021/0307254 A1    Oct. 7, 2021

Related U.S. Application Data

(60) Provisional application No. 63/003,355, filed on Apr. 1, 2020.

(51) Int. Cl.
*A01G 7/04*      (2006.01)
*H10H 20/824*    (2025.01)
*A01G 22/15*     (2018.01)

(52) U.S. Cl.
CPC ......... *A01G 7/045* (2013.01); *H10H 20/8242* (2025.01); *A01G 22/15* (2018.02)

(58) Field of Classification Search
CPC ...... A01G 7/045; A01G 9/249; H01L 33/305; H01L 51/50; F21Y 2113/30; F21Y 2113/10; F21Y 2113/13; F21Y 2113/17
See application file for complete search history.

(56) References Cited

U.S. PATENT DOCUMENTS 9,439,989 B2    9/2016 Lalicki et al.
9,857,068 B2    1/2018 Nguyen et al.
(Continued)

FOREIGN PATENT DOCUMENTS

CA    2994308 C  *  2/2020  ............ A01G 7/045
CN    102182965 A    9/2011
(Continued)

OTHER PUBLICATIONS

Chen et al., UVA Radiation Is Beneficial for Yield and Quality of Indoor Cultivated Lettuce, Dec. 6, 2019, pp. 1-10, vol. 10, Art. 1563, Frontiers in Plant Science.
(Continued)

*Primary Examiner* — Joshua D Huson
*Assistant Examiner* — Alanna K Peterson
(74) *Attorney, Agent, or Firm* — LaBatt, LLC

(57) ABSTRACT

A light source for plant cultivation includes a first light source emitting a first type of light for photosynthesis of a plant and a second light source emitting a second type of light for adjustment of phytochemicals in the plant. The first type of light has at least one peak in the visible spectrum, and the second type of light has a peak in a different wavelength band from the first light source. The second type of light has a peak in the wavelength band of about 360 nm to about 420 nm.

20 Claims, 24 Drawing Sheets

(56) References Cited

U.S. PATENT DOCUMENTS

| | | | | |
|---|---|---|---|---|
| 9,927,095 | B2* | 3/2018 | Ichihashi | A01G 9/249 |
| 10,238,043 | B1* | 3/2019 | Vardi | F21V 23/003 |
| 10,244,595 | B2* | 3/2019 | Grajcar | H05B 45/46 |
| 10,683,990 | B2* | 6/2020 | Dutta | A01G 7/045 |
| 10,978,620 | B2* | 4/2021 | Amiya | C09K 11/77348 |
| 11,166,415 | B2* | 11/2021 | Barber, III | A61L 2/0076 |
| 11,273,324 | B2* | 3/2022 | Rantala | A61L 2/10 |
| 11,304,376 | B2* | 4/2022 | McClear | A01G 7/045 |
| 11,395,461 | B2 | 7/2022 | Oh et al. | |
| 11,547,062 | B2 | 1/2023 | Oh et al. | |
| 2010/0039804 | A1* | 2/2010 | Budde | H05B 45/22 356/402 |
| 2013/0044474 | A1 | 2/2013 | Aikala et al. | |
| 2013/0264934 | A1 | 10/2013 | Osaki et al. | |
| 2015/0128489 | A1* | 5/2015 | Yamada | A01G 7/045 47/58.1 LS |
| 2016/0030609 | A1 | 2/2016 | Peterson et al. | |
| 2017/0241632 | A1 | 8/2017 | Nguyen et al. | |
| 2018/0323351 | A1* | 11/2018 | Chen | H01L 33/507 |
| 2019/0000020 | A1* | 1/2019 | Theisen | A01G 7/045 |
| 2020/0000043 | A1* | 1/2020 | Bennett | A01G 9/249 |
| 2020/0060098 | A1 | 2/2020 | Kim et al. | |
| 2020/0063931 | A1 | 2/2020 | Song et al. | |

FOREIGN PATENT DOCUMENTS

| | | | | |
|---|---|---|---|---|
| CN | 103220902 | A | 7/2013 | |
| CN | 103476243 | A | 12/2013 | |
| CN | 103563101 | A | 2/2014 | |
| CN | 106413378 | A | 2/2017 | |
| CN | 107356569 | A | 11/2017 | |
| CN | 107535212 | A | 1/2018 | |
| CN | 108232019 | A * | 6/2018 | H01L 33/04 |
| JP | 2014510528 | A | 5/2014 | |
| JP | 2015133939 | A | 7/2015 | |
| JP | 2016189741 | A | 11/2016 | |
| KR | 20000006611 | A * | 2/2000 | A01G 7/045 |
| KR | 101027205 | B1 | 4/2011 | |
| KR | 20130052306 | A | 5/2013 | |
| KR | 1020130052306 | A | 5/2013 | |
| KR | 1020130114880 | A | 10/2013 | |
| KR | 20140045111 | A | 4/2014 | |
| KR | 1020170141974 | A | 12/2017 | |
| KR | 20180009115 | A | 1/2018 | |
| KR | 1020180006325 | A | 1/2018 | |
| KR | 1020190122456 | A | 10/2019 | |
| WO | 2019203597 | A1 | 10/2019 | |

OTHER PUBLICATIONS

Kang et al., Ultraviolet—A Radiation Stimulates Growth of Indoor Cultivated Tomato (*Solanum lycopersicum*) Seedlings, HortScience, Oct. 2018, pp. 1429-1433, vol. 53(10).

Lee et al., Short-term UV-A LED Irradiation Improves Growth and Phytochemicals of Kale Plants, Korean Journal of Horticultural Science & Technology, May 2016, p. 96, vol. 34, No. 1, Document No. 102.

Maxwell et al., Chlorophyll Fluorescence—A Practical Guide, Journal of Experimental Botany, Apr. 2000, pp. 659-668, vol. 51, No. 345, Oxford University Press.

Ritchie, Chlorophyll Fluorescence: What Is It and What Do the Numbers Mean? USDA Forest Service Proceedings RMRS P-43, 2006, pp. 34-43.

Office Action issued in United States U.S. Appl. No. 17/073,763, mailed May 11, 2021.

International Search Report for corresponding International Application No. PCT/KR2021/004083, mailed Jul. 22, 2021, 2 pages.

Extended European Search Report for European Application No. 21780855.9, Mar. 28, 2024, 8 pages.

International Search Report for International Application No. PCT/KR2019004711, Aug. 2, 2019, 2 pages.

Lichtenthaler, Hartmut K., et al., Detection of photosynthetic activity and water stress by imaging the red chlorophyll fluorescence, 2000, pp. 889-895, 38, Plant Physiol. Biochem., Germany and Albania.

Lee et al., Growth and Phenolic Content of Sowthistle Grown in a Closed-type Plant Production System with a UV-A or UV-B Lamp, 2013, pp. 492-500, 54(6), Hort. Environ. Biotechnol.

Kim, Damin, Determination of Optimal UV Stress Period before Harvest for Maximizing Phytochemical Production of Kale Cultivated in Plant Factories, Aug. 2017, 39 pages, The Graduate School of Seoul National University.

Final Office Action for U.S. Appl. No. 17/073,763, Sep. 24, 2021, 14 pages.

Office Action for U.S. Appl. No. 17/073,763, Jan. 28, 2022, 15 pages.

Final Office Action for U.S. Appl. No. 17/073,763, filed Jun. 10, 2022, 13 pages.

Notice of Allowance for U.S. Appl. No. 17/073,763, Sep. 8, 2022, 7 pages.

Extended European Search Report for European Application No. EP 19788361.4, Jan. 5, 2022, 8 pages.

Office Action for Chinese Application No. 201980002969.3, Jan. 12, 2022, 8 pages (No English translation available).

\* cited by examiner

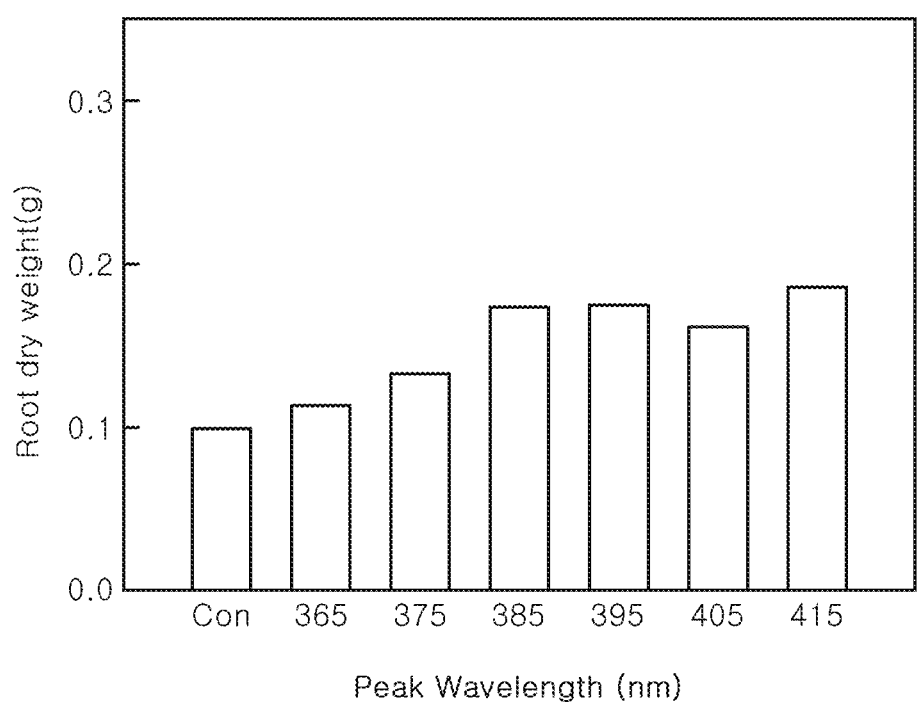

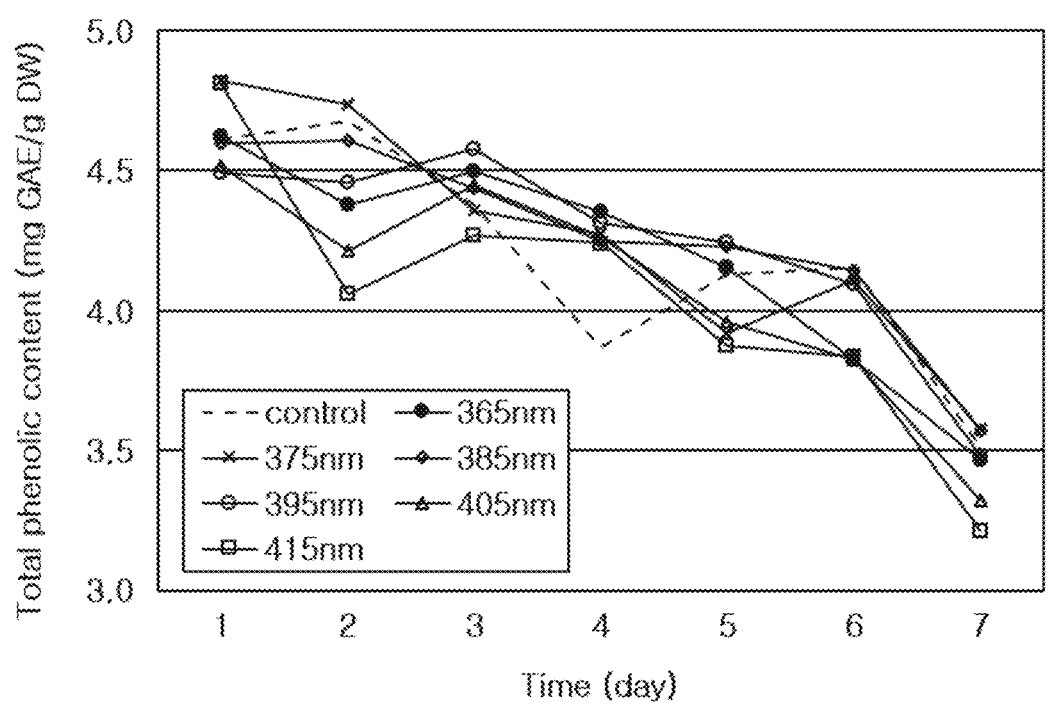

LIGHT SOURCE FOR PLANT CULTIVATION AND METHOD OF PLANT CULTIVATION USING THEREOF

CROSS-REFERENCE OF RELATED APPLICATIONS AND PRIORITY

The present application is a Non-provisional Application which claims priority to the benefit of Provisional Application No. 63/003,355 filed Apr. 1, 2020, the disclosure of which is incorporated herein by its entirety.

TECHNICAL FIELD

Embodiments of the present disclosure relate to a light source for plant cultivation and a plant cultivation method using the same and, more particularly, to a light source, which emits light optimal for synthesis of substances beneficial to humans in a plant, and a plant cultivation method using the same.

BACKGROUND

As a luminaire for plant cultivation, various light sources have been developed and used to replace or supplement sunlight. Conventionally, incandescent lamps and fluorescent lamps have mainly been used as luminaires for plant cultivation. However, most typical luminaires for plant cultivation are limiting as they provide light having a specific wavelength suitable for photosynthesis of plants and do not have any additional functions.

Plants can synthesize substances beneficial to humans through resistance to various stresses. Therefore, there is a need for a light source for plant cultivation, which can promote production of substances beneficial to humans in a plant, a cultivation apparatus including the same, and a cultivation method using the same.

SUMMARY

Embodiments of the present disclosure provide a light source for plant cultivation, which can promote production of functional substances beneficial to humans in a plant.

Embodiments of the present disclosure provide a plant cultivation method which can promote growth of a plant using the light source for plant cultivation.

In accordance with one aspect of the present disclosure, a light source for plant cultivation includes a first light source emitting a first type of light for photosynthesis of a plant, the first type of light having at least one peak in the visible spectrum, and a second light source emitting a second type of light for adjustment of phytochemicals in the plant, the second type of light having a peak in a different wavelength band from the first light source. The second light source includes a first semiconductor layer doped with a first conductivity type dopant, a second semiconductor layer disposed on the first semiconductor layer and doped with a second conductivity type dopant different from the first conductivity type dopant, and an active layer interposed between the first semiconductor layer and the second semiconductor layer, and the second type of light has a peak in the wavelength band of about 360 nm to about 420 nm.

In at least one variant, the second type of light may be ultraviolet light, purple light or blue light.

In another variant, the second type of light may have a peak in the wavelength band of about 400 nm to about 420 nm.

In further another variant, the first type of light may have at least two peaks in the wavelength band of about 380 nm to about 780 nm.

In another variant, the first type of light may correspond to PAR (Photosynthetic Active Radiation).

In another variant, the first light source may emit light having a sunlight-like spectrum in the visible wavelength band.

In another variant, the first type of light may have one peak in the wavelength band of about 420 nm to about 500 nm and another peak in the wavelength band of about 600 nm to about 700 nm.

In another variant, the first light source and the second light source may be independently driven to be turned on or off.

In another variant, the first light source may include a first semiconductor layer doped with a first conductivity type dopant, a second semiconductor layer disposed on the first semiconductor layer and doped with a second conductivity type dopant different from the first conductivity type dopant, and an active layer interposed between the first semiconductor layer and the second semiconductor layer.

In at least one variant, the first light source may be turned on or off according to a photo-period consisting of a light period and a dark period.

In another variant, the second type of light may be emitted for a period of time for which the light period and the dark period at least partially overlap each other. In one embodiment, the second type of light may be continuously emitted.

In another variant, the phytochemicals may include at least one selected from among phenolic and antioxidant substances.

In another variant, the plant may be a cruciferous plant and the cruciferous plant may include at least one selected from among kale, broccoli, cabbage, Chinese cabbage, shepherd's purse, bok choy, oilseed rape, radish, and mustard.

In accordance with another aspect of the present disclosure, there is provided a plant cultivation method using the light source for plant cultivation set forth above, wherein the light source for plant cultivation emits the first type of light and the second type of light to the plant to adjust the content of phytochemicals in the plant.

In cultivation of plants using a light source according to one or more embodiments of the present disclosure, it is possible to easily increase the content of functional substances beneficial to humans in the plants while substantially not affecting or rather enhancing growth of the plants.

DESCRIPTION OF DRAWINGS

FIG. 4A shows the second type of light had peak wavelength of 365 nm, 375 nm, 385 nm, 395 nm, 405 nm, and 415 nm in Treatment groups 1 to 6;

FIG. 4B shows the second type of light had peak wavelength of 375 nm in Treatment groups 1 to 6;

FIG. 4C shows the second type of light had peak wavelength of 385 nm in Treatment groups 1 to 6;

FIG. 4D shows the second type of light had peak wavelength of 395 nm in Treatment groups 1 to 6;

FIG. 4E shows the second type of light had peak wavelength of 405 nm in Treatment groups 1 to 6; and FIG. 4F shows the second type of light had peak wavelength of 415 nm in Treatment groups 1 to 6.

FIG. 5A shows peak wavelengths of a first type of light and the wavelength of the second type of light in FIG. 4A;

FIG. 5B shows peak wavelengths of the first type of light and the wavelength of the second type of light in FIG. 4B;

FIG. 5C shows peak wavelengths of the first type of light and the wavelength of the second type of light in FIG. 4C;

FIG. 5D shows peak wavelengths of the first type of light and the wavelength of the second type of light in FIG. 4D;

FIG. 5E shows peak wavelengths of the first type of light and the wavelength of the second type of light in FIG. 4E; and FIG. 5F shows peak wavelengths of the first type of light and the wavelength of the second type of light in FIG. 4F.

FIG. 8B is a graph depicting dry weights of the root part on day 7.

FIG. 17A is a graph depicting a phenolic content per gram of plant in dry weight and FIG. 17B is a graph depicting a phenolic content per plant.

DETAILED DESCRIPTIONS OF EMBODIMENTS

Figure 1:
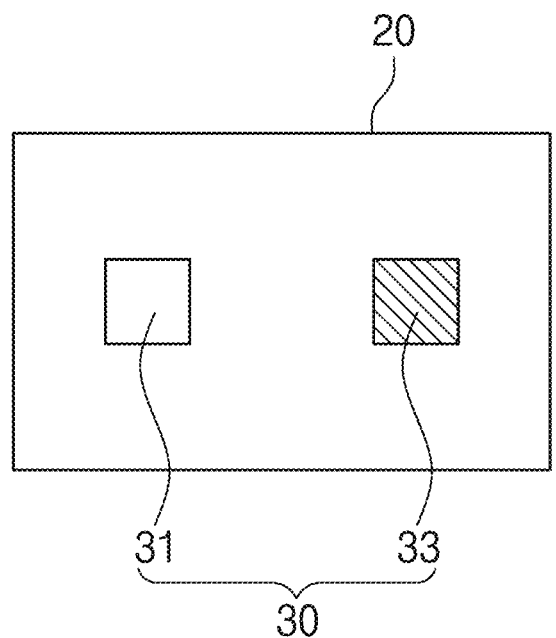
FIG. 1 is a plan view of a light source for plant cultivation according to one embodiment of the present disclosure.

The present disclosure may be realized by various embodiments and some exemplary embodiments of the present disclosure will be described in detail with reference to the accompanying drawings. However, it should be understood that the present disclosure is not limited to the following embodiments, and that various modifications, substitutions, and equivalent embodiments can be made by those skilled in the art without departing from the spirit and scope of the present disclosure.

Like components will be denoted by like reference numerals throughout the specification. It should be noted that the drawings may be exaggerated in thickness of lines or size of components for descriptive convenience and clarity only. It will be understood that, although the terms "first", "second", and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element or component discussed below could also be termed a "second" element or component, or vice versa, without departing from the scope of the present disclosure. As used herein, the singular forms "a" and "an" are intended to include the plural forms as well, unless the context clearly indicates otherwise.

It will be understood that the terms "includes", "comprises", "including" and/or "comprising," when used in this specification, specify the presence of stated features, steps, operations, elements, and/or components, but do not preclude the presence or addition of one or more other features, steps, operations, elements, components, and/or groups.

The present disclosure relates to a light source used in plant cultivation. A light source according to one or more embodiments of the present disclosure may be used in a plant factory to supply light to plants in the plant factory. Herein, the term "plant factory" refers to a system that can automatically produce a crop all year regardless of season and location by artificially controlling aerial-zone environmental factors (light, temperature, humidity, carbon dioxide concentration, and the like) and root-zone environmental factors (culture medium acidity, concentration, and nutrient composition, and the like) of the crop in a facility and by automating related tasks. One of the greatest advantages of the plant factory is the ability thereof to provide complete control over aerial and root-zone environments in which the crop grows.

Plants convert light in the visible spectrum into chemical energy through photosynthesis. Irradiation of a plant with light other than visible light can increase the content of substances that have health benefits in humans (when ingested) or the plant itself (hereinafter referred to as "phytochemicals"). In one embodiment, a light source provides non-visible light capable of increasing the content of phytochemicals in a plant in addition to light in the visible wavelength band. Here, the phytochemicals are substances considered to have beneficial effects on human health, and include, for example, phenolic and antioxidant substances.

The light source according to the embodiments described below may be used in cultivation of various plants. However, photosynthetic efficiency of light emitted from the light source or the degree of increase in content of the phytochemicals may differ from plant to plant. The light source according to the embodiments may be used in cultivation of cruciferous plants. Examples of the cruciferous plants may include kale, broccoli, cabbage, Chinese cabbage, shepherd's purse, bok choy, oilseed rape, radish, and mustard. In one embodiment, the light source may be used in cultivation of kale, which is a cruciferous plant. However, it will be understood that the present disclosure is not limited thereto and the light source may be used in cultivation of various other plants. Hereinafter, the present disclosure will be described by way of example with reference to a structure in which the light source is used in cultivation of cruciferous plants, particularly kale, for convenience of description.

Figure 2:
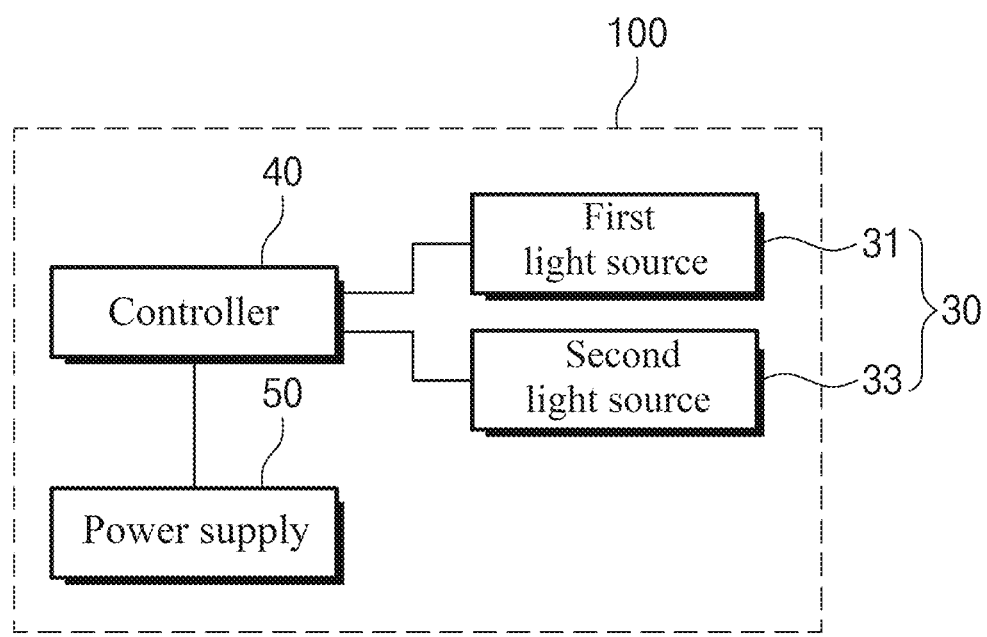
FIG. 2 is a block diagram of a light source module for plant cultivation according to one embodiment of the present disclosure.

FIG. 1 is a plan view of a light source for plant cultivation according to one embodiment of the present disclosure and FIG. 2 is a block diagram of a light source module for plant cultivation according to one embodiment of the present disclosure.

Embodiments of the present disclosure relate to a light source for plant cultivation. The light source for plant cultivation includes multiple light emitting devices supplying light to a plant. Although the light source may include two or more light emitting devices in some embodiments, the present disclosure will be described by way of example with reference to a structure in which the light source includes two light emitting devices. However, it will be understood that the present disclosure is not limited thereto and the light source may include three or more light emitting devices.

Referring to FIG. 1 and FIG. 2, a light source module 100 for plant cultivation includes a light source 30 emitting light needed for a plant, a controller 40 controlling the light source 30, and a power supply 50 supplying electric power to the light source 30 and/or the controller 40.

The light source 30 may include first and second light sources 31, 33, which emit first and second types of light having spectral peaks at different wavelengths, respectively. At least one of the first and second light sources 31, 33 emits light in the wavelength band used for photosynthesis of plants and the other light source emits light in the wavelength band used for synthesis or adjustment of phytochemicals of the plants. In the following embodiments, light in the wavelength band used for photosynthesis of the plants will be referred to as a first type of light and a light source emitting the first type of light will be referred to as a first light source. In addition, light in the wavelength band used for synthesis or adjustment of phytochemicals of the plants will be referred to as a second type of light and a light source emitting the second type of light will be referred to as a second light source.

In some forms, the first type of light may correspond to light in the visible spectrum for photosynthesis of the plants. The first type of light may have a wavelength in the wavelength band of about 380 nm to about 780 nm, which substantially corresponds to the entire wavelength band of visible light. In at least one variant, the first type of light may have a wavelength in a portion of the entire wavelength band of visible light, for example, in the wavelength band of about 400 nm to about 700 nm. Light in the wavelength band of about 400 nm to about 700 nm is in the wavelength band typically used by plants for photosynthesis, specifically light in the photosynthetically active radiation (PAR) range. In other forms, various light sources may be used as the first light source adapted to emit the first type of light. For example, sunlight or a light source adapted to emit a sunlight-like spectrum in the visible wavelength band may be used. When sunlight is used, an additional component capable of blocking or transmitting sunlight may be provided to turn on/off the sunlight. The light source adapted to emit the sunlight-like spectrum may include an incandescent lamp, a fluorescent lamp, and a light emitting device including a light emitting diode, which may be used alone or in combination to implement the sunlight-like spectrum. In particular, the light emitting device may include a single or multiple light emitting diodes adapted to emit light having a certain wavelength in order to implement the sunlight-like spectrum.

Furthermore, in some forms, the first type of light may have at least two peaks in the wavelength band of about 400 nm to about 700 nm. For example, the first type of light may have a first peak in the wavelength band of about 420 nm to about 500 nm and a second peak in the wavelength band of about 600 nm to about 700 nm.

In some embodiments, the first light source may be selected from among various light sources including sunlight, an incandescent lamp, a fluorescent lamp, and a light emitting diode (LED), which can supply light used by plants for photosynthesis. In one embodiment, the first light source may be a light emitting diode.

The first light source may be implemented by a single or multiple light emitting devices that emit light in the wavelength band described above. For example, the first light source may include a blue light emitting device and a red light emitting device, or may include a red light emitting device, a blue light emitting device, and a white light emitting device. For example, the first light source 31 may be implemented with multiple light emitting diodes among light emitting devices. By way of example only, red light emitting diodes R, white light emitting diodes W, and blue light emitting diodes B may be provided in a ratio (R:W:B) of 8:1:1, without being limited thereto.

The second type of light serves to increase the content of phytochemicals, for example, phenolic and antioxidant substances, in a plant. In one embodiment, the second type of light may have a wavelength in the wavelength band of UV light to blue light or purple light in the visible spectrum. Further, according to one embodiment, the second type of light may have a wavelength in a portion of the entire wavelength band of visible light, for example, in the wavelength band corresponding to UVA light. According to one embodiment, the second type of light may have a peak in the wavelength band of about 360 nm to about 420 nm or a peak in the wavelength band of about 400 nm to about 420 nm.

In one form, the first light source 31 may emit light having an intensity of about 100 $\mu molm^{-2}s^{-1}$ to about 200 $\mu molm^{-2}s^{-1}$. Alternatively, the first light source 31 may emit light having an intensity of about 130 $\mu molm^{-2}s^{-1}$ to about 170 $\mu molm^{-2}s^{-1}$, specifically about 150 $\mu molm^{-2}s^{-1}$.

In another form, the second light source 33 may emit light at an irradiance of about 20 $W/m^2$ to about 40 $W/m^2$, specifically about 30 $W/m^2$.

In some forms, the first light source 31 and the second light source 33 may be independently driven. In other words, operation of the first light source 31 takes place, independent of operation of the second light source 33. Additionally, or alternatively, for the first light source 31 and the second light source 33 each composed of multiple light emitting devices, each of the light emitting devices may also be independently driven.

Accordingly, one of the first light source 31 and the second light source 33 may be turned on alone, or both the first light source 31 and the second light source 33 may be turned on or off. In some forms, the first light source 31 and the second light sources 33 may be independently turned on/off to supply light having a predetermined spectrum to a plant. The plant may be irradiated with light emitted from the first light source 31 and the second light source 33 according to a growth period thereof, that is, the light period or the dark period thereof.

In other forms, the first light source 31 may be turned on or off according to a photo-period having the light period and the dark period. Accordingly, the first type of light is emitted for the light period and is not emitted for the dark period. The second type of light may be emitted for a period of time for which the light period and the dark period at least partially overlap each other. For example, the second type of light may be continuously emitted for the light period and the dark period. However, it should be noted that the second type of light is not necessarily continuously emitted always and may be emitted in a flashing manner.

By way of example, the photo-period of the first light source 31 may include a light period of about 10 hours to about 15 hours and a dark period of about 14 hours to about 9 hours, and the first light source 31 may be turned on for the light period and may be turned off for the dark period. In other forms, the light period may include about 12 hours and the dark period may include about 12 hours. The second light source may be continuously turned on for a predetermined period of time regardless of the photo-period, after a plant is grown to a predetermined level. For example, after a plant is sown and grown to a predetermined level, the second light source may be turned on for about a week to provide the second type of light to the plant, or may be turned on for about a week before harvesting to provide the second type of light to the plant.

As such, it is possible to produce phytochemicals, for example, phenolic and antioxidant substances or to adjust the content thereof in the plant without interrupting photosynthesis of the plant by suitably controlling the wavelength band, light intensity, irradiation energy, and irradiation period of the first type of light and the second type of light.

As shown in FIG. 1, the first light source 31 and the second light source 33 may be disposed on a substrate 20. The substrate 20 may be a printed circuit board formed with an interconnect or a circuit to allow the first light source 31 and the second light source 33 to be directly mounted thereon, without being limited thereto. The shape and structure of the substrate are not particularly restricted so long as the first light source 31 and the second light source 33 can be disposed thereon. In some embodiments, the substrate 20 may be omitted.

In one embodiment, the controller 40 is connected to the first light source 31 and/or the second light source 33 to control operations of the first light source 31 and the second light source 33. The controller 40 may be connected to the first light source 31 and the second light source 33 in a wired or wireless manner. The power supply 50 is connected to the controller 40 to supply electric power to the controller 40. The power supply 50 may be connected to the light source 30 directly or through the controller 40 to supply electric power to the light source 30.

The controller 40 may control On/Off of the first light source 31 and/or the second light source 33 such that each of the first light source 31 and the second light source 33 emits light at a predetermined intensity for a predetermined period of time. The first light source 31 and the second light source 33 may be individually operated such that the plant can perform photosynthesis with maximum efficiency. Emission intensity or emission timing of the first light source 31 and the second light source 33 may be individually controlled by the controller 40. In addition, when the first light source 31 and/or the second light source 33 include multiple light emitting devices, the light emitting devices may be individually controlled by the controller.

The controller 40 may control operations of the first light source 31 and the second light source 33 according to a preset process or user input. Operations of the first light source 31 and the second light source 33 may be varied depending on the kind of plant, the growth stage of the plant, and the like.

Plants may be cultivated through photosynthesis with light emitted from the light source 30 according to the present disclosure. For example, the plants may be cultivated using various methods, such as hydroponics or soil cultivation.

In one embodiment, the first light source and the second light source, particularly the second light source, may be implemented with a light emitting diode. For example, the first light source may be implemented by various types of light sources including a typical light source for photosynthesis and the second light source may be implemented by a light emitting diode. Alternatively, both the first light source and the second light source may be implemented with light emitting diodes.

Figure 3:
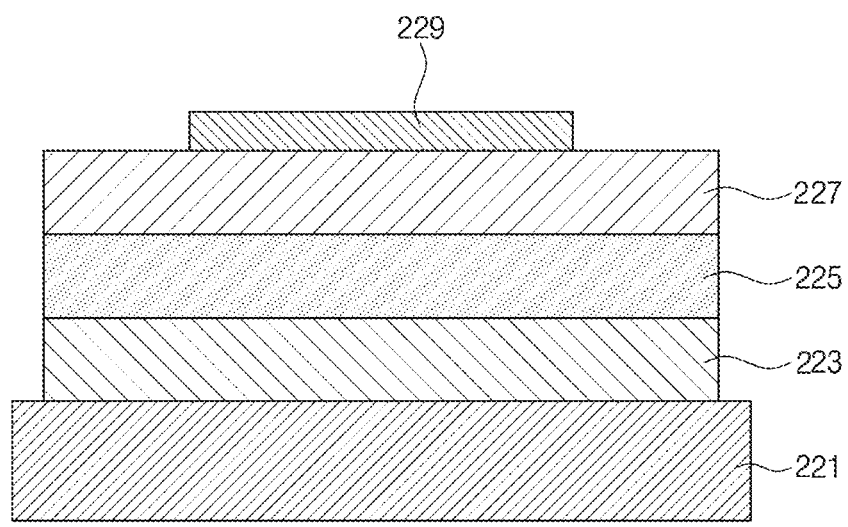
FIG. 3 is a view of a light emitting device used as a light source according to one embodiment of the present disclosure.
Figure 4A:
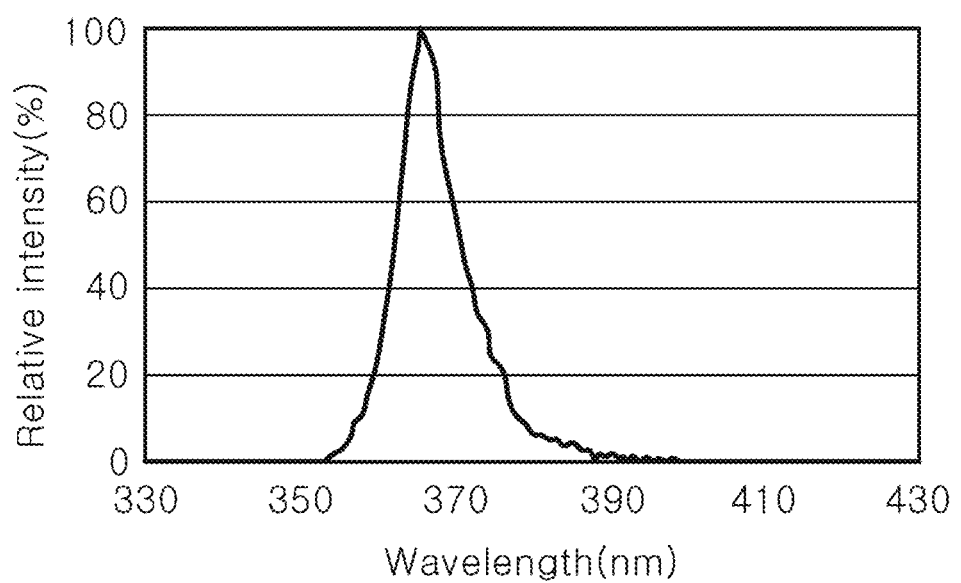
FIG. 4A to FIG. 4F show peak wavelengths of a second type of light used in experiments, where.
Figure 4B:
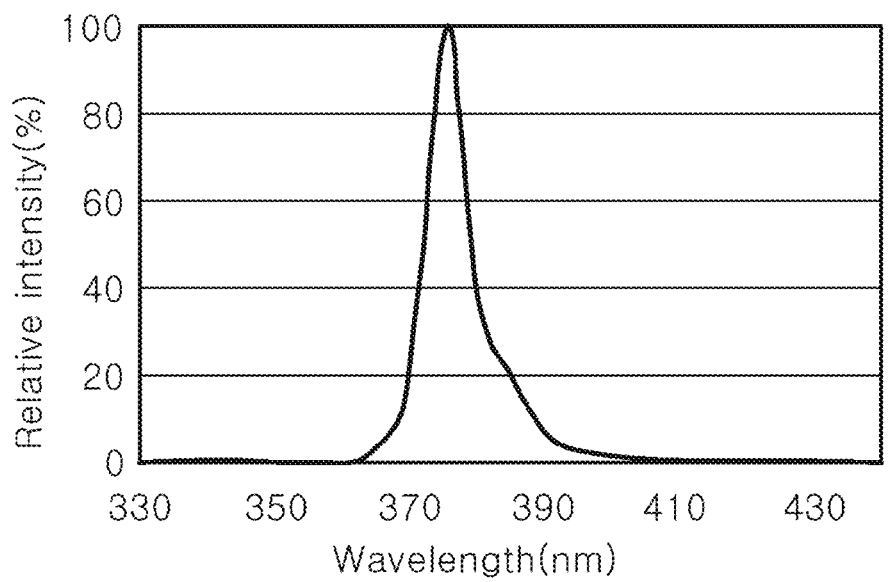
Figure 4C:
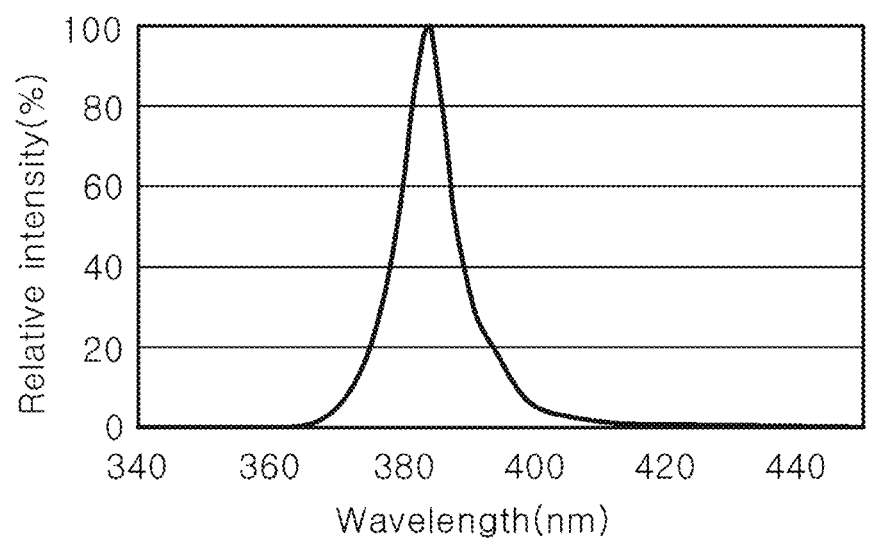
Figure 4D:
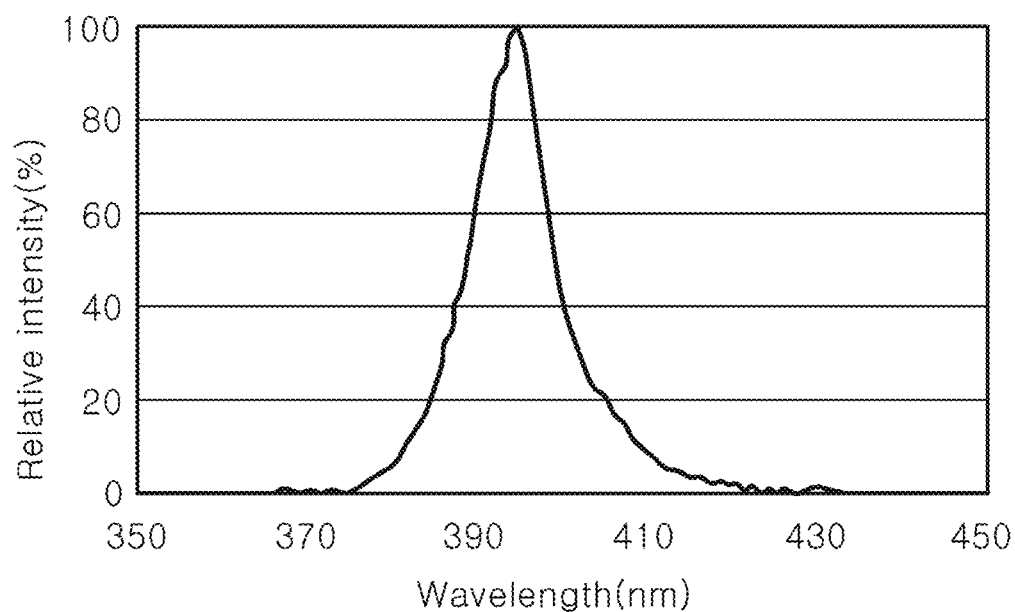
Figure 4E:
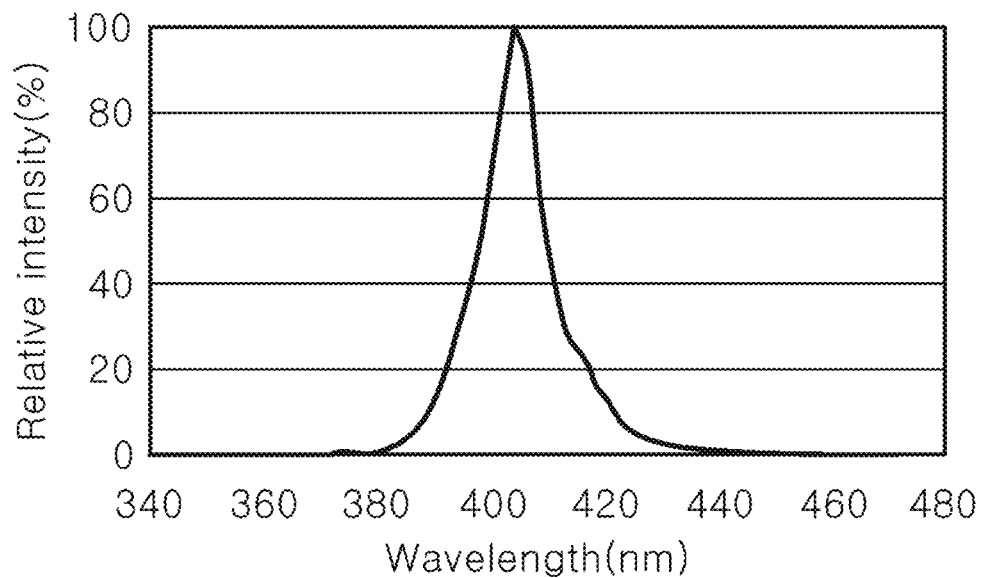
Figure 4F:
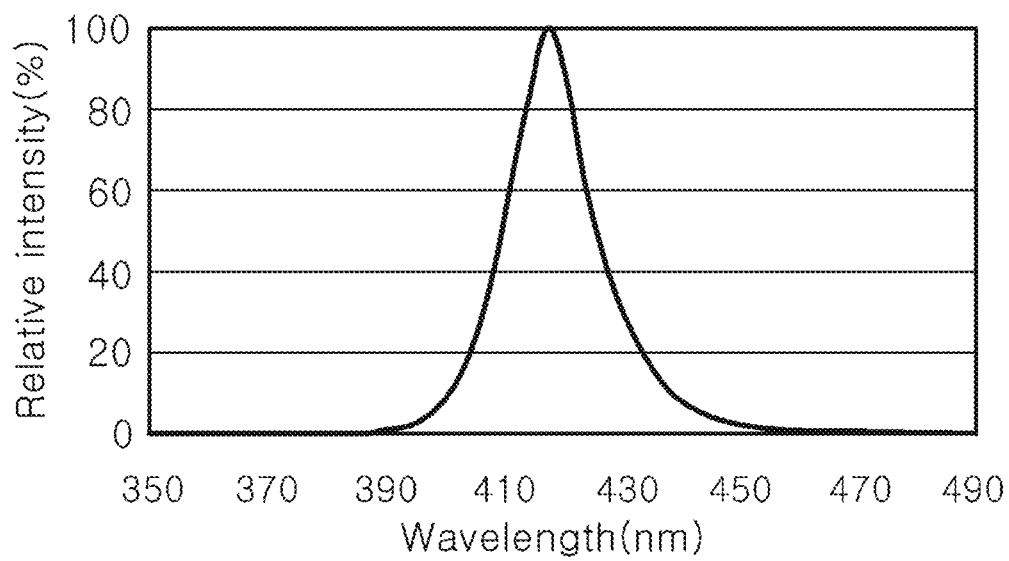
Figure 5A:
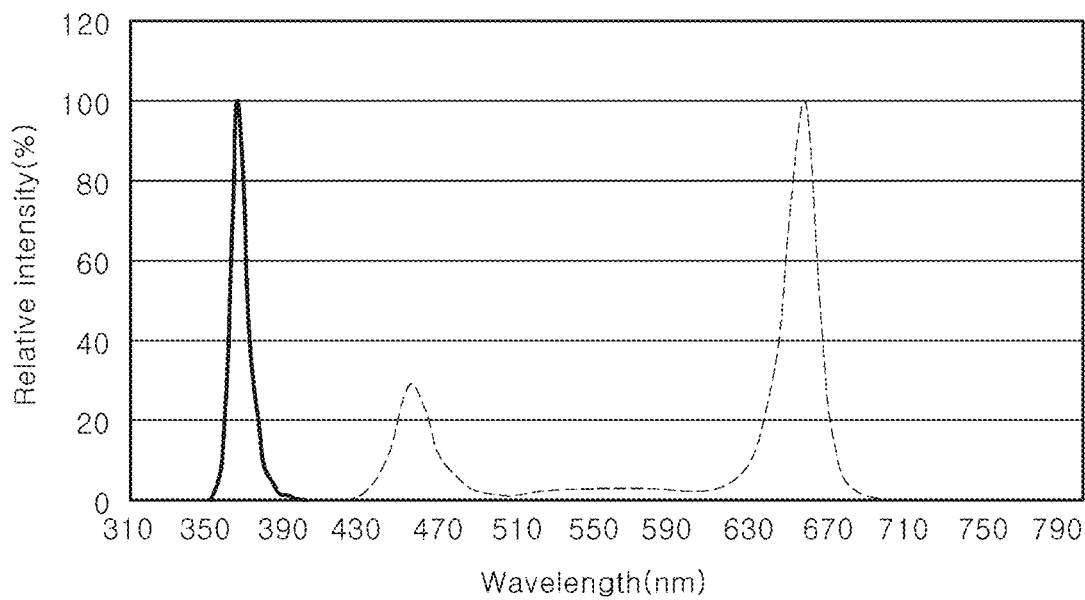
FIG. 5A to FIG. 5F show peak wavelengths of a first type of light used together with the second type of light of FIG. 4A to FIG. 4F, where.
Figure 5B:
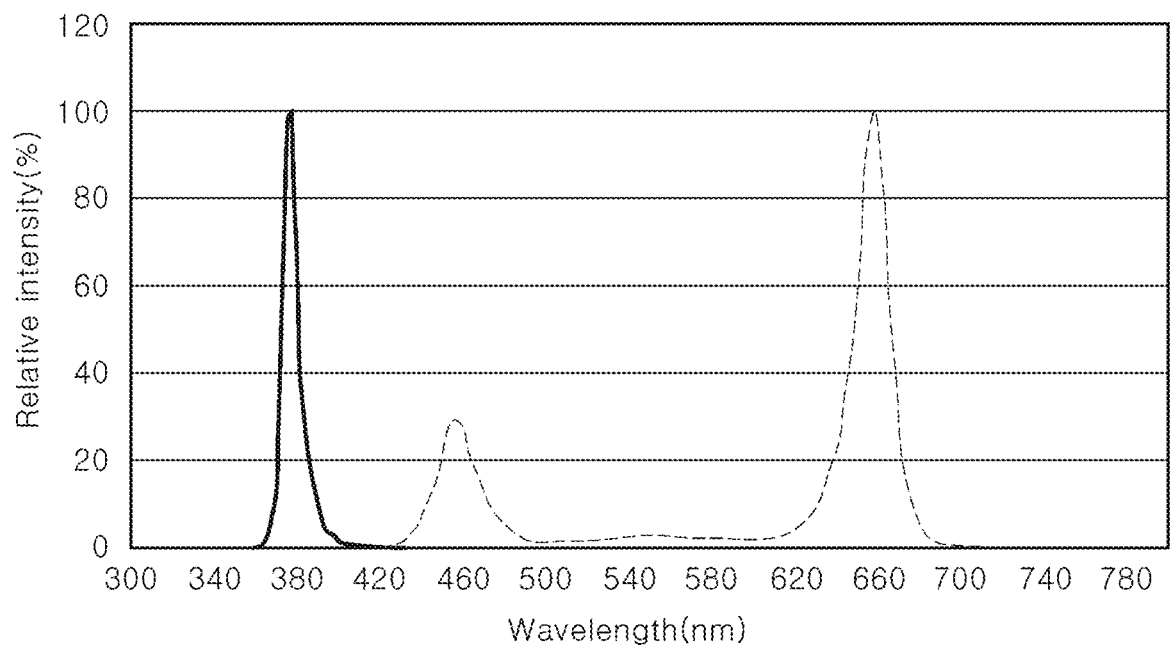
Figure 5C:
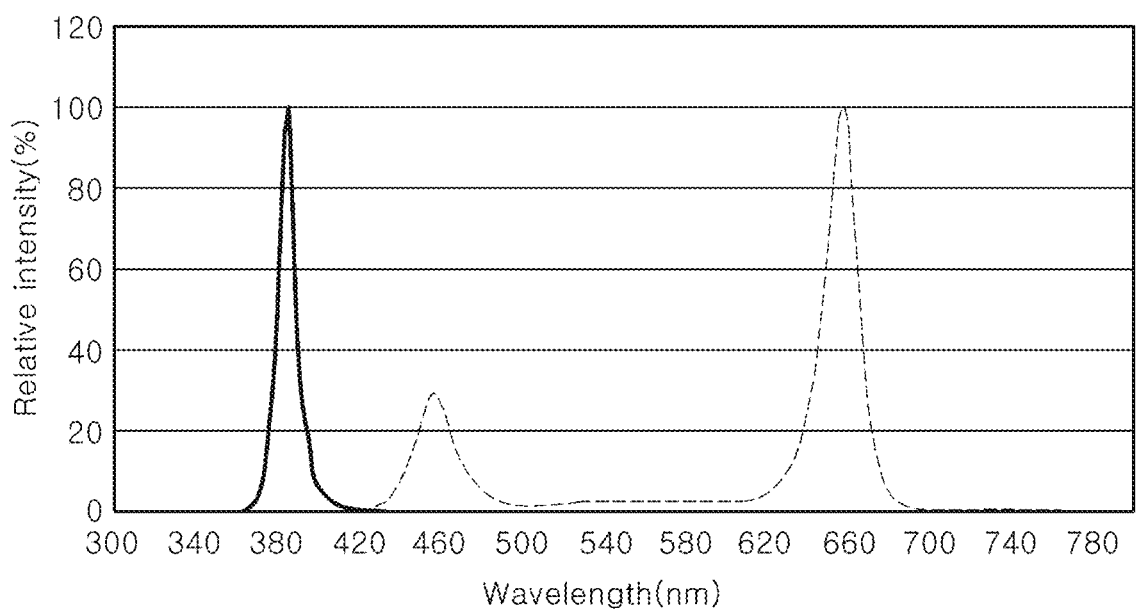
Figure 5D:
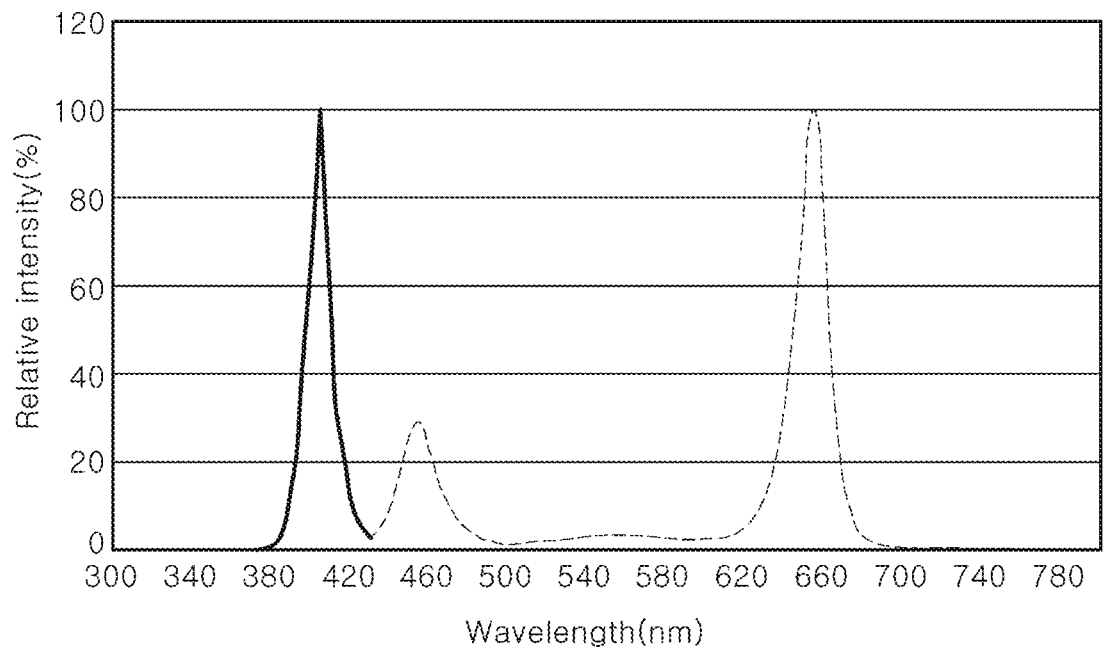
Figure 5E:
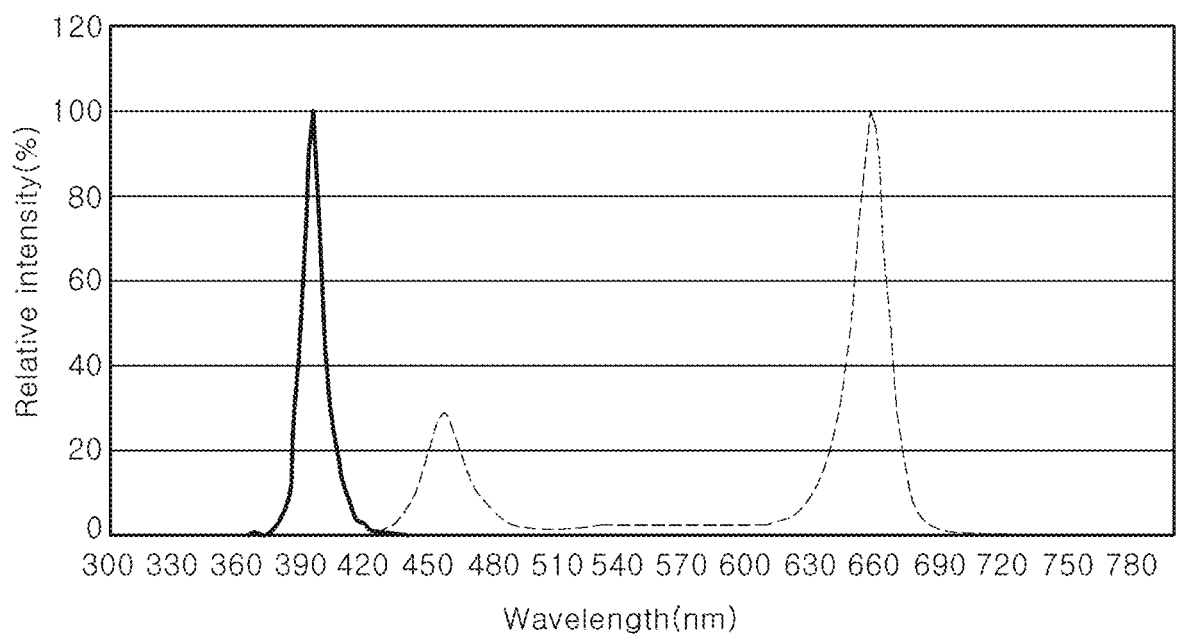
Figure 5F:
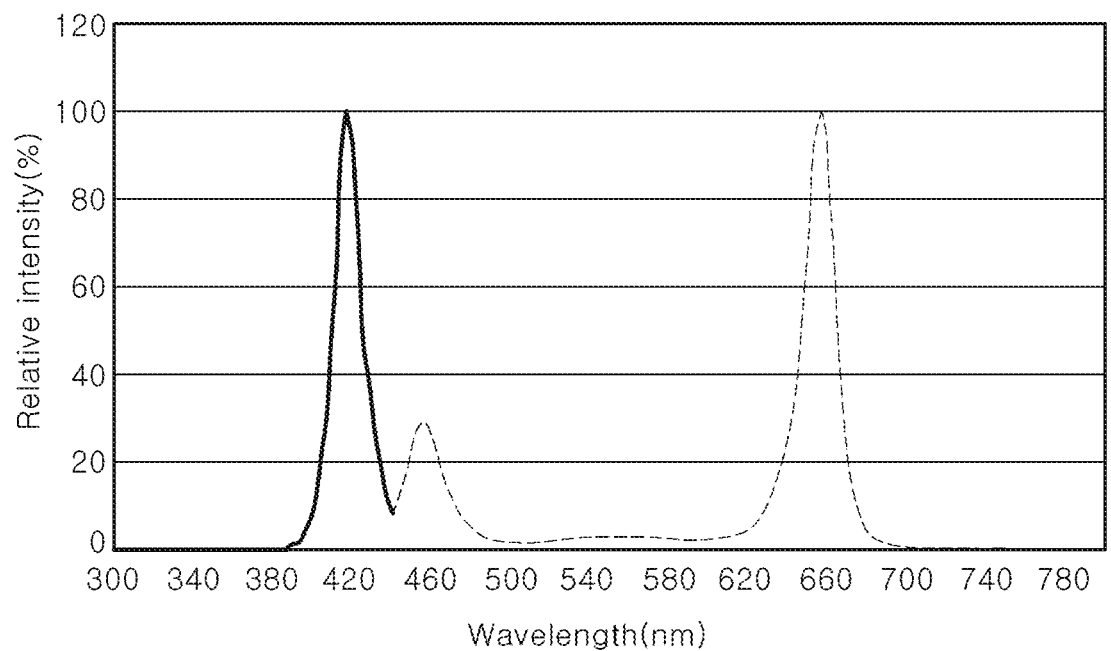

FIG. 3 is a schematic view of a light emitting device used as the first and second light sources according to one embodiment of the present disclosure.

Referring to FIG. 3, each of the first light source and the second light source may be implemented by a light emitting device, for example, a light emitting diode. The light emitting diode may include: a light emitting structure including a first semiconductor layer 223, an active layer 225, and a second semiconductor layer 227; and a first electrode 221 and a second electrode 229 connected to the light emitting structure.

The first semiconductor layer 223 is a semiconductor layer doped with a first conductivity type dopant. The first conductivity type dopant may be a p-type dopant. The first conductivity type dopant may be Mg, Zn, Ca, Sr, Ba, or the like. In one embodiment, the first semiconductor layer 223 may include a nitride-based semiconductor material. In one embodiment, the first semiconductor layer 223 may be formed of a material including GaN, AlN, AlGaN, InGaN, InN, InAlGaN, AlInN, and the like.

The active layer 225 is disposed on the first semiconductor layer 223 and corresponds to a light-emitting layer. The active layer 225 is a layer in which electrons (or holes) injected through the first semiconductor layer 223 and holes (or electrons) injected through the second semiconductor layer 227 recombine with one another to emit light due to a bandgap difference between energy bands of materials forming the active layer 225.

The active layer 225 may be implemented by a compound semiconductor. For example, the active layer 225 may be implemented by at least one selected from among group III-V compound semiconductors and group II-VI compound semiconductors.

The second semiconductor layer 227 is disposed on the active layer 225. The second semiconductor layer 227 is a semiconductor layer doped with a second conductivity type dopant having an opposite polarity to the first conductive dopant. The second conductivity type dopant may be an n-type dopant. For example, the second conductivity type dopant may include Si, Ge, Se, Te, O, C, and the like.

In one embodiment, the second semiconductor layer 227 may be formed of a nitride-based semiconductor. For example, the second semiconductor layer 227 may be formed of a material including GaN, AlN, AlGaN, InGaN, InN, InAlGaN, AlInN, and the like.

The first electrode 221 and the second electrode 229 may be provided in various forms to be connected to the first semiconductor layer 223 and the second semiconductor layer 227, respectively. Although the first electrode 221 and the second electrode 229 are illustrated as being disposed on a lower surface of the first semiconductor layer 223 and an upper surface of the second electrode 229, respectively, in this embodiment, it should be understood that the present disclosure is not limited thereto. In one embodiment, the first electrode 221 and the second electrode 229 may be formed of, for example, various metals, such as Al, Ti, Cr, Ni, Au, Ag, Ti, Sn, Ni, Cr, W, and, Cu, or alloys thereof. The first electrode 221 and the second electrode 229 may have a monolayer structure or a multilayer structure.

In this embodiment, the light emitting diode is a vertical light emitting diode, but it will be understood that the light emitting diode is not necessarily a vertical light emitting diode and may include various other types of light emitting diodes without departing from the spirit of the present disclosure.

As in the embodiment, use of the light emitting diode as the light source for plant cultivation instead of typical lamps provides the following effects.

Unlike typical lamps (for example, typical incandescent lamps), the light emitting diode can treat the plant with light having a specific wavelength, when used as the light source according to the embodiment. Light emitted from the typical lamp has a broader spectrum than light emitted from the light emitting diode. As a result, it is difficult to separate a light component in a specific wavelength band from light emitted from the typical lamp. In contrast, light emitted from the light emitting diode has a spectrum with a sharp peak at a specific wavelength, whereby the light emitting diode can provide a specific wavelength of light having a much narrower full width at half maximum than light emitted from typical lamps. Accordingly, the light emitting diode can be advantageously used to selectively provide only light having a specific wavelength needed for the plant. As a result, a user can freely choose either light in a broad spectrum or light having a specific wavelength, as needed.

In addition, the typical lamps have difficulty in irradiating the plant at a clearly defined irradiance, whereas the light emitting diode can irradiate the plant at a clearly defined irradiance. Further, since the typical lamps have difficulty in irradiating the plant at a clearly defined irradiance, it is necessary to set a broad irradiation time range. In contrast, the light emitting diode can provide light required for the plant within a relatively short and clearly defined timeframe.

As described above, the typical lamps have difficulty in delivering an accurate dose of radiation to the plant due to a relatively broad wavelength band, a relatively broad irradiance range, and a relatively broad irradiation time range thereof. In contrast, the light emitting diode can deliver an accurate dose of radiation due to a relatively narrow wavelength band, a relatively narrow irradiance range, and a relatively narrow irradiation time range thereof.

In addition, the typical lamps take a considerable amount of time to reach a maximum irradiance thereof after being powered on. In contrast, the light emitting diode requires little or no warm-up time and can reach a maximum irradiance thereof immediately after being powered on. Thus, the light emitting diode allows precise control over irradiation time upon supplying the plant with light having a specific wavelength.

Further, the light emitting diode is more economically beneficial than typical fluorescent lamps due to lower heat generation, lower energy consumption, and longer lifespan thereof.

The light source for plant cultivation as set forth above can promote production of secondary metabolites, which are represented by phytochemicals including phenolic substances and antioxidant substances. The light source according to the present disclosure may provide a plant cultivation method that can promote production of a plant containing large amounts of such phytochemicals.

Next, experiments were conducted to determine effects on growth of kale and production of the secondary metabolites under various conditions using the light source for plant cultivation according to the embodiments of the present disclosure.

Experimental Example 1: Cultivation Environment

Seeds of kale ('Manchoo Collard', *Brassica oleracea* var. *acephala*) were sown in a seed growing pack and grown into seedlings for 2 weeks, which were in turn transplanted into a deep-flow technique (DFT) hydroponics system under a closed plant production system, followed by cultivation for 3 weeks. Cultivation was carried out in a plant factory under conditions of temperature: 20° C., humidity: 60%, light period: 12 hours, and photosynthetic photon flux density (PPFD): 150 $\mu molm^{-2}s^{-1}$, and Hoagland's solution was used as a culture medium to meet EC 1 (unit) and pH 6.0.

Treatment with the second type of light started 3 weeks after transplantation and was continued for seven (7) days, and sampling was carried out every day for seven (7) days.

To ascertain a difference under treatment with the second type of light, fresh weight, dry weight, total chlorophyll content, chlorophyll a/b, photosynthesis, image fluorescence, total phenol concentration, antioxidant capacity, reactive oxygen species (ROS), and phenylalanine ammonia-lyase (PAL) of the plant were measured as follows.

Experimental Example 2: Irradiation Condition

An experiment was carried out to set irradiation conditions to increase the content of secondary metabolites in kale.

Table 1 shows wavelengths and irradiance of light in Treatment groups and Control group under treatment with the second type of light.

TABLE 1

| Treatment condition | Treatment group 1 | Treatment group 2 | Treatment group 3 | Treatment group 4 | Treatment group 5 | Treatment group 6 | Control group |
|---|---|---|---|---|---|---|---|
| Peak wavelength (nm) | 365 | 375 | 385 | 395 | 405 | 415 | — |
| Irradiance (W/m²) | 30 | 30 | 30 | 30 | 30 | 30 | — |

FIG. 4A to FIG. 4F show peak wavelengths of a second type of light used in Treatment groups 1 to 6, and FIG. 5A to FIG. 5F show peak wavelengths of a first type of light (dotted line in FIG. 5A to FIG. 5F) and the wavelengths of the second type of light (solid line in FIG. 5A to FIG. 5F) in FIG. 4A to FIG. 4F.

Referring to FIG. 4A to FIG. 4F and FIG. 5A to FIG. 5F, in this experimental example, the first type of light had a peak wavelength in the range of about 600 nm to about 710 nm and the second type of light had peak wavelengths of 365 nm, 375 nm, 385 nm, 395 nm, 405 nm, and 415 nm in Treatment groups 1 to 6, respectively.

Referring to Table 1, light having a wavelength of 365 nm (Treatment group 1), a wavelength of 375 nm (Treatment group 2), a wavelength of 385 nm (Treatment group 3), a wavelength of 395 nm (Treatment group 4), a wavelength of 405 nm (Treatment group 5), and a wavelength of 415 nm (Treatment group 6) was emitted at an irradiance of 30 W/m².

The Control group was not subjected to treatment with the second type of light and the first type of light was emitted under the same conditions in the Treatment groups and the Control group.

In this experiment, kale seedlings were irradiated with the first type of light under the condition of PPFD: 150 μmolm⁻²s⁻¹ from 7 a.m. to 7 p.m. for 2 weeks, after plantation of the kale seedlings to the plant factory of the DFT system.

While irradiating with the first type of light, treatment with the second type of light started 3 weeks after transplantation and continued for 24 hours per day for 7 days, and sampling was carried out at 5 p.m. every day for 7 days.

Experimental Example 3: Fresh Weight and Dry Weight after Irradiation

The fresh weight and dry weight of kale were measured to ascertain a difference between results under the respective treatment conditions in Experimental Example 1. In the following graphs, the vertical line of each item indicates a standard error (n=5) and the significance test shows $p<0.05$ using ANOVA.

Figure 6A:
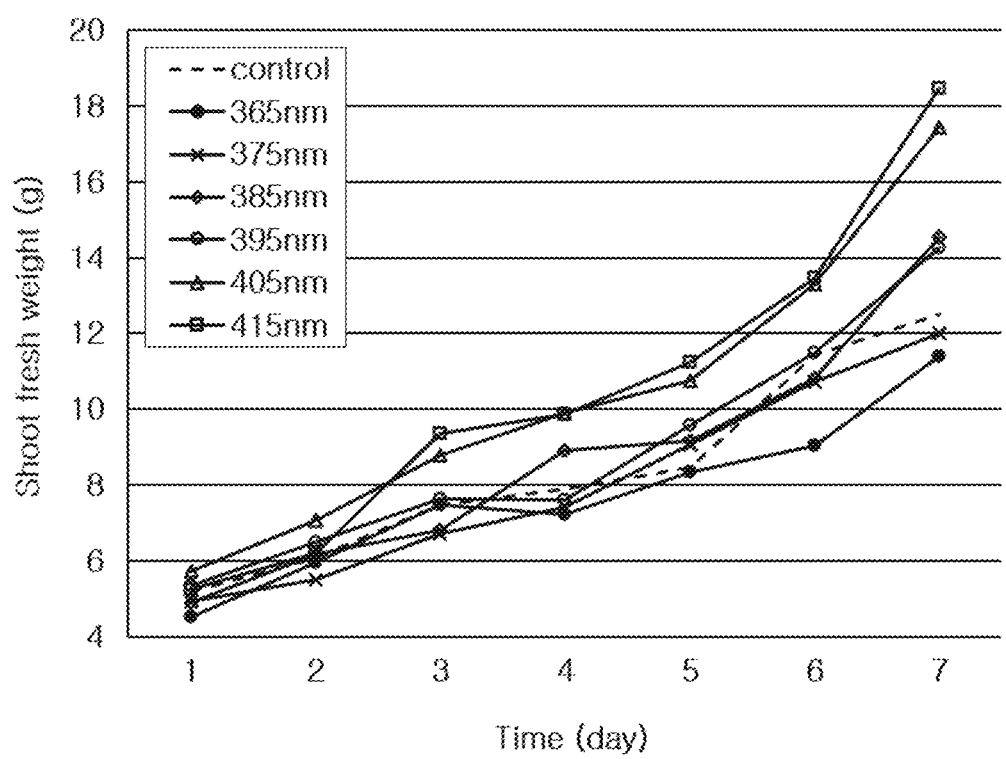
FIG. 6A is a graph showing variation in fresh weights of aerial parts cultivated under different treatment conditions for 7 days, that is, Treatment groups 1 to 6 and a Control group.
Figure 6B:
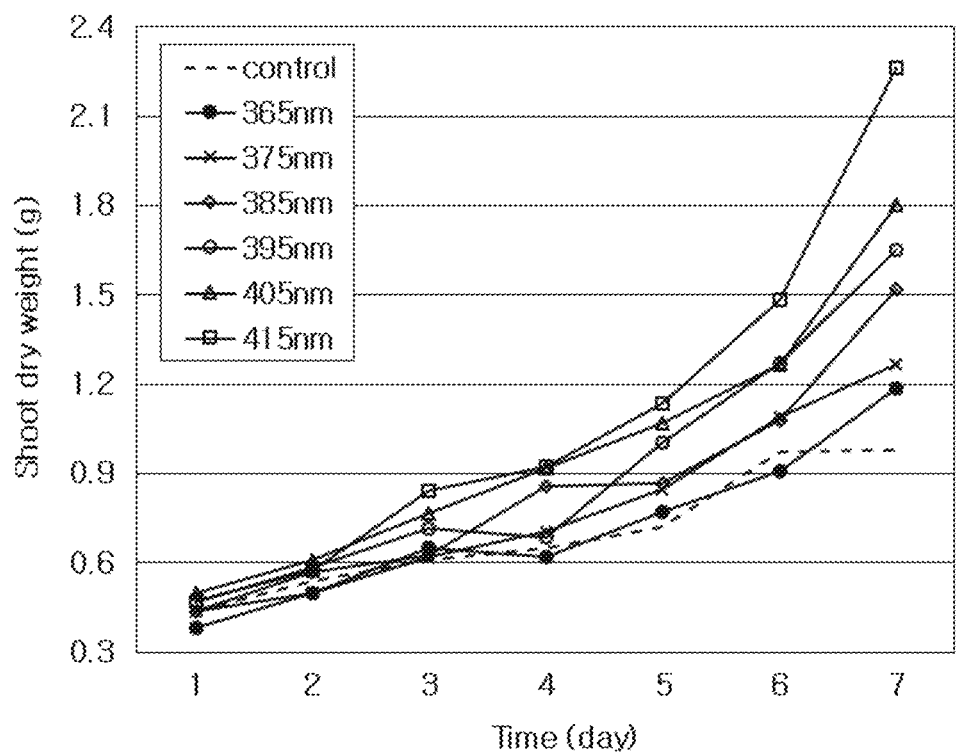
FIG. 6B is a graph showing variation in dry weights of the aerial parts cultivated under different treatment conditions for 7 days, that is, Treatment groups 1 to 6 and a Control group.

FIG. 6A is a graph showing variation in fresh weights of aerial parts cultivated under different treatment conditions for 7 days, that is, Treatment groups 1 to 6 and Control group FIG. 6B is a graph showing variation in dry weights of the aerial parts cultivated under different treatment conditions for 7 days, that is, Treatment groups 1 to 6 and Control group.

In each of the graphs, the Control group is marked by Control or con and Treatment groups 1 to 6 are marked by 365 nm, 375 nm, 385 nm, 395 nm, 405 nm, and 415 nm at the peak wavelength, respectively.

Referring to FIG. 6A, on day 7, the Treatment groups marked as 405 nm and 415 nm at the peak wavelength had the highest fresh weight of the aerial part and other Treatment groups did not exhibit a significant difference from the Control group. This result indicates that treatment with the second type of light did not provide any detrimental effect on growth of kale or provided a growth enhancement effect.

Referring to FIG. 6B, the dry weight of the aerial part is similar to the fresh weight of the aerial part. On day 7, the treatment group marked by 415 nm at the peak wavelength had the highest dry weight of the aerial part and the dry weight of the aerial part tended to increase with increasing wavelength in the Treatment groups. Accordingly, it could be seen that treatment with the second type of light did not provide any detrimental effect on growth of kale or provided a growth enhancement effect.

Figure 7A:
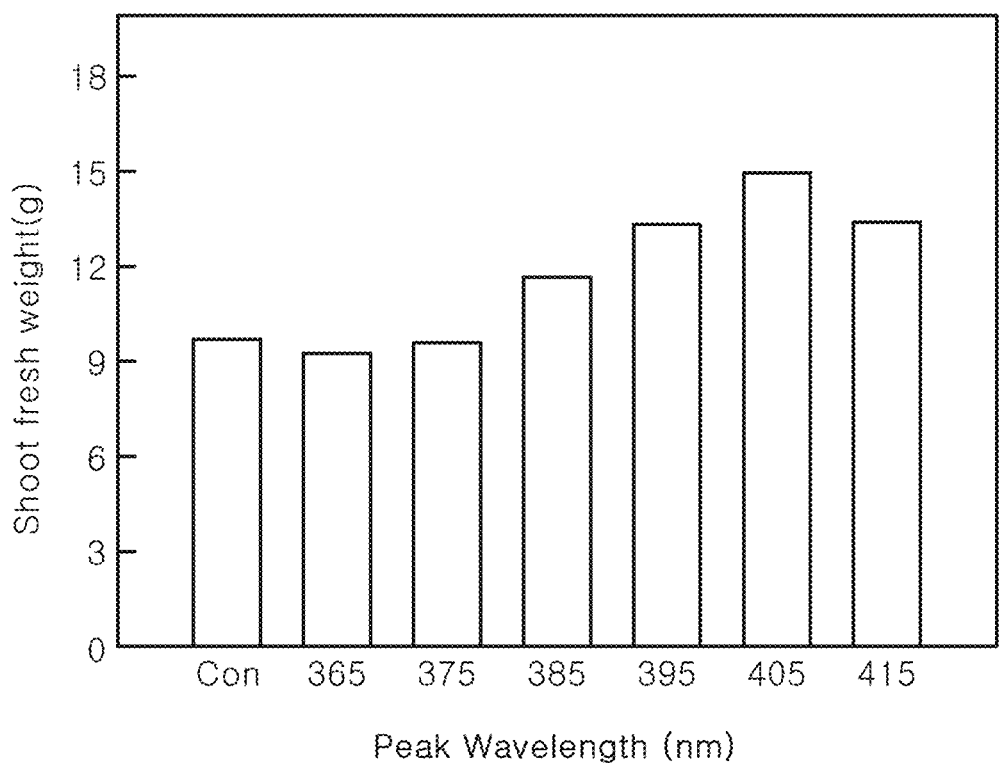
FIG. 7A is a graph depicting fresh weights of the aerial part on day 7.
Figure 7B:
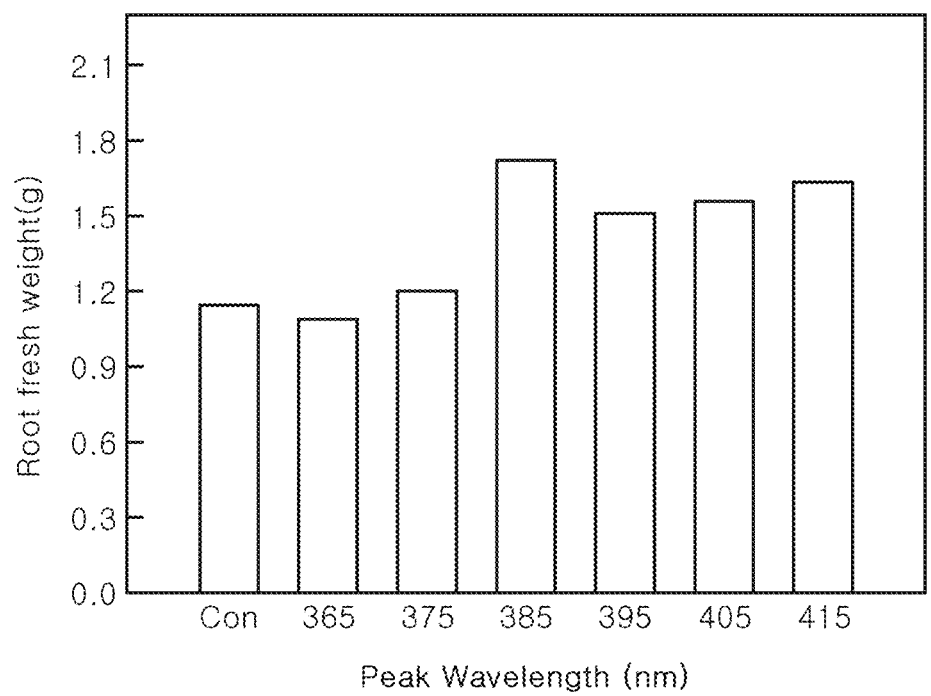
FIG. 7B is a graph depicting fresh weights of the root part on day 7.

FIG. 7A and FIG. 7B are graphs depicting the fresh weights of the aerial part and the root part on day 7.

Referring to FIG. 7A and FIG. 7B, the Treatment groups marked as 395 nm, 375 nm, 385 nm, 395 nm, 405 nm and 415 nm had high fresh weights of the aerial part and other treatment groups did not exhibit a significant difference from the Control group (marked as "Con"). The treatment group marked as 385 nm had the highest fresh weight of the root part and it is determined that other treatment groups did not exhibit a significant difference from the Control group.

Figure 8A:
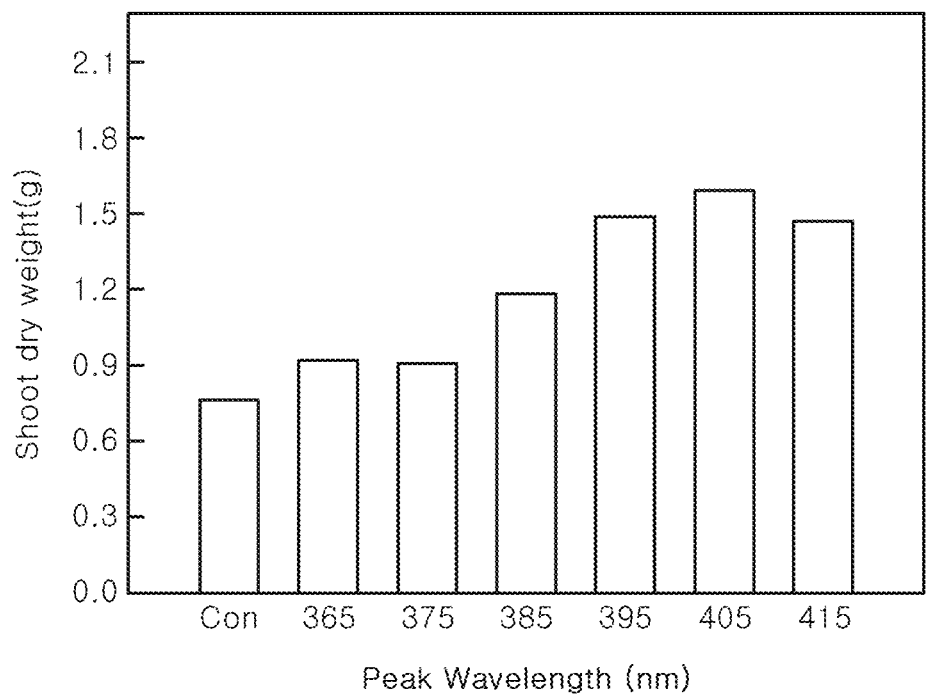
FIG. 8A is a graph depicting dry weights of the aerial part on day 7.

FIG. 8A and FIG. 8B are graphs depicting dry weights of the aerial part and the root part on day 7.

Referring to FIG. 8A and FIG. 8B, the Treatment groups marked as 395 nm 375 nm, 385 nm, 395 nm, 405 nm and 415 nm had higher dry weights of the aerial part than the Control group and the Treatment groups marked as 385 nm, 405 nm and 415 nm had high dry weights of the root part. It is determined that other treatment groups did not exhibit a significant difference from the Control group.

Figure 9:
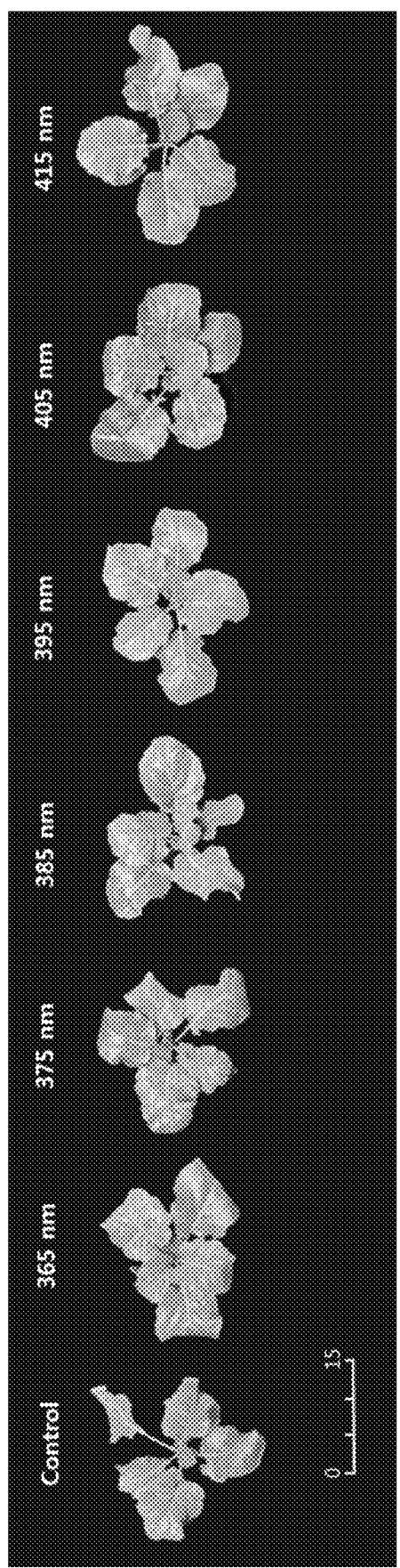
FIG. 9 illustrates kale cultivated under different treatment conditions for 7 days, that is, Treatment groups 1 to 6 and a Control group, on day 7.

FIG. 9 is pictures of kale cultivated under different treatment conditions for 7 days, that is, Treatment groups 1 to 6 (marked as 395 nm 375 nm, 385 nm, 395 nm, 405 nm and 415 nm, respectively) and Control group, on day 7. Referring to FIG. 9, it is determined that, although it appeared that the Treatment groups exhibited slight improvement in growth, as compared with the Control group, there were no significant characteristics observable with the naked eye.

In the above experiment, the Treatment groups generally had higher fresh weights and higher dry weights than the Control group, and there was a relatively large difference in dry weight between the Control group and the Treatment groups, as compared with the fresh weight. As the fresh weight and the dry weight were increasing with increasing wavelengths in treatment of the Treatment groups with light, it was ascertained that treatment with UVA and/or blue light/red light did not provide any detrimental effect on growth of kale or provided a growth enhancement effect.

Experimental Example 4: Variation in Leaf Area and a Count of Leaves after Irradiation with Light FIG. 10A and FIG. 10B are graphs depicting leaf areas and a count of leaves on day 7, respectively.

Figure 10A:
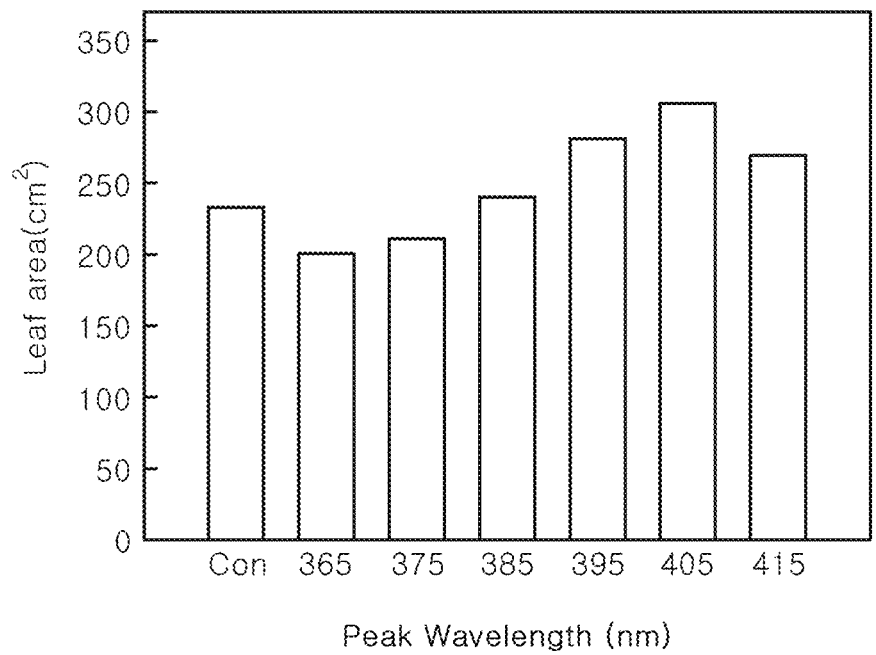
FIG. 10A is a graph depicting leaf areas on day 7.

Referring to FIG. 10A, on day 7, the treatment group marked as 405 nm had the largest leaf area, the Treatment group marked as 365 nm had the smallest leaf area, and the leaf areas generally tended to increase with increasing wavelength, as shown in FIG. 10A. However, it was ascertained that there was no significant difference between the Treatment groups and the Control group.

Figure 10B:
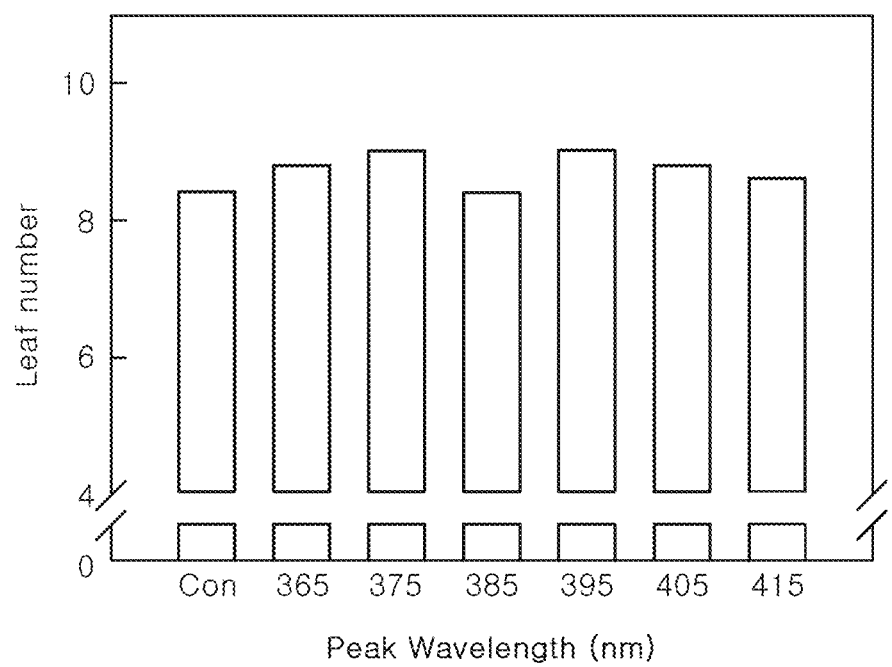
FIG. 10B is a graph depicting a number of leaves on day 7.

Referring to FIG. 10B, the Control group and the Treatment groups were generally similar in terms of a count of leaves and there was no significant difference between the Treatment groups and the Control group.

Experimental Example 5: Variation in Chlorophyll Content after Irradiation with Light On four weeks after plantation of kale, the aerial part was harvested and freeze-dried at −75° C. for about 72 hours, followed by pulverization for 3 minutes at about 15,000 rpm using a mill to obtain a powder sample for analysis. 40 mg of the powder sample was used and 80% acetone was added to 4 ml of the sample, followed by extraction using ultrasound. Thereafter, 1 ml of the sample was extracted and absorbance was measured under conditions of about 663.2 nm and about 646.8 nm using a spectrophotometer.

Figure 11A:
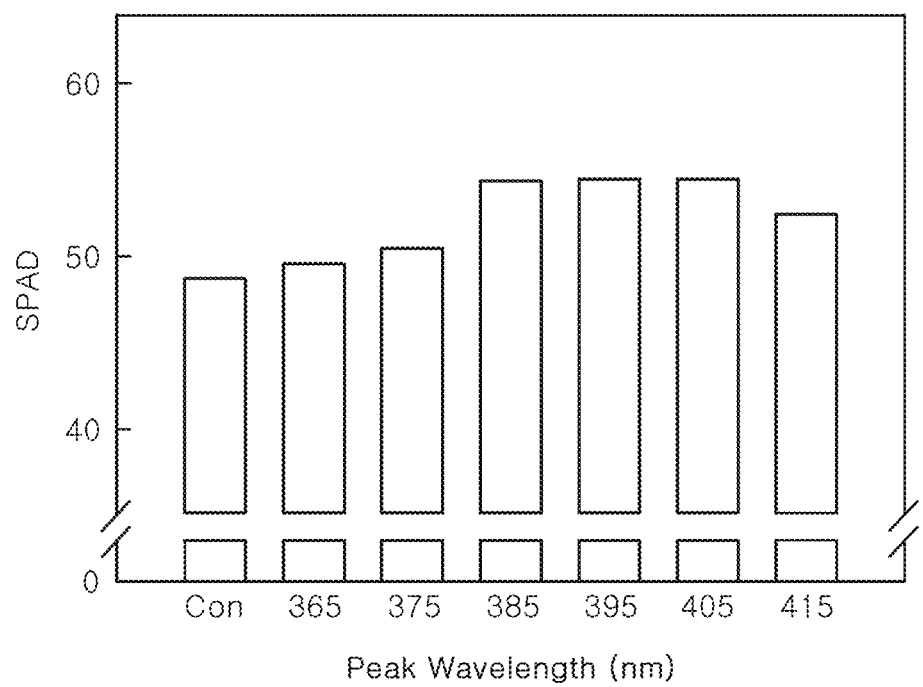
FIG. 11A is a graph depicting an SPAD value on day 7.
Figure 11B:
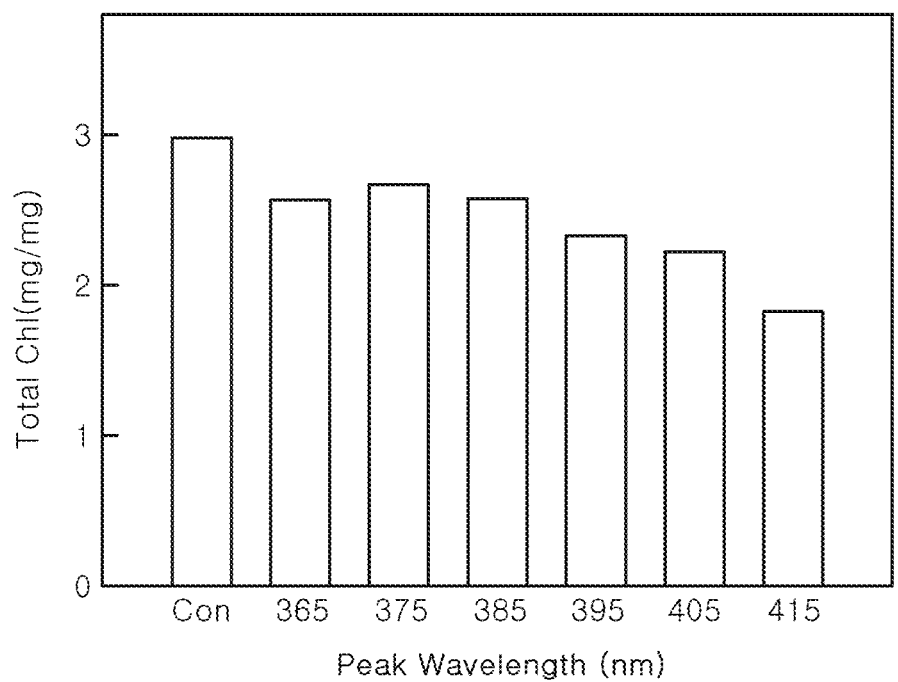
FIG. 11B is a graph depicting total chlorophyll content on day 7.

FIG. 11A and FIG. 11B are graphs depicting SPAD values and the total chlorophyll content on day 7, respectively.

In FIG. 11A, the vertical items indicate Soil Plant Analysis Development (SPAD) values measured using a SPAD chlorophyll meter (SPAD-502) and a higher SPAD value can be interpreted as a higher content of chlorophyll. Although Treatment Groups 3 to 5 had high values on the graph, it was determined that there was no significant difference.

Referring to FIG. 11B, on day 7, the Control group has the highest total content of chlorophyll and the content of chlorophyll tended to decrease with increasing wavelength. Here, it was ascertained that only the treatment group marked as 415 nm exhibited a significant difference with the Control group and other Treatment groups did not exhibit a significant difference.

Experimental Example 6: Measurement of Photosynthesis Rate after Irradiation with Light On days 3 and 4 after treatment with the second type of light, the photosynthesis rate was measured using a photosynthesis tester (LI-6400, LI-COR, Lincoln, NE, USA). A chamber set to the following environmental conditions: a carbon dioxide ($CO_2$) concentration of 500 $\mu molmol^{-1}$, a temperature of 20° C. and a flux of 400 $\mu mols^{-1}$ was placed under each light source at an intensity (PPFD) of 150 $\mu molm^{-2}s^{-1}$, and the photosynthesis rate was measured using completely unfolded leaves between about 3 hours to about 6 hours after the light source was turned on. The photosynthesis rate was measured under the same conditions after the light source was turned off.

Figure 12A:
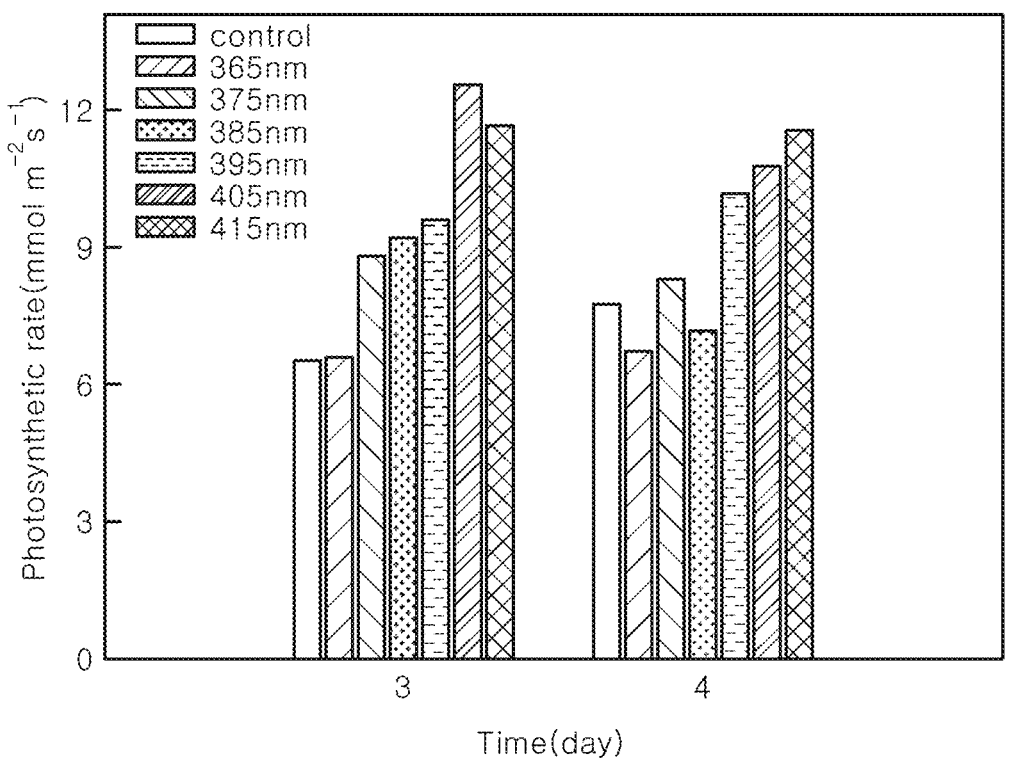
FIG. 12A is a graph depicting a photosynthesis rate measured for a day on days 3 and 4.

FIG. 12A is a graph depicting the photosynthesis rate measured for a day on days 3 and 4.

Referring to FIG. 12A, on days 3 and 4, the photosynthesis rate measured for a day tended to increase with increasing wavelength, and the Treatment groups marked as 405 nm and 415 nm exhibited the highest photosynthesis rates. On day 3, only the Treatment groups marked as 405 nm and 415 nm exhibited a significant difference with the Control group and, on day 4, all of the Treatment groups did not exhibit a significant difference with the Control group.

Figure 12B:
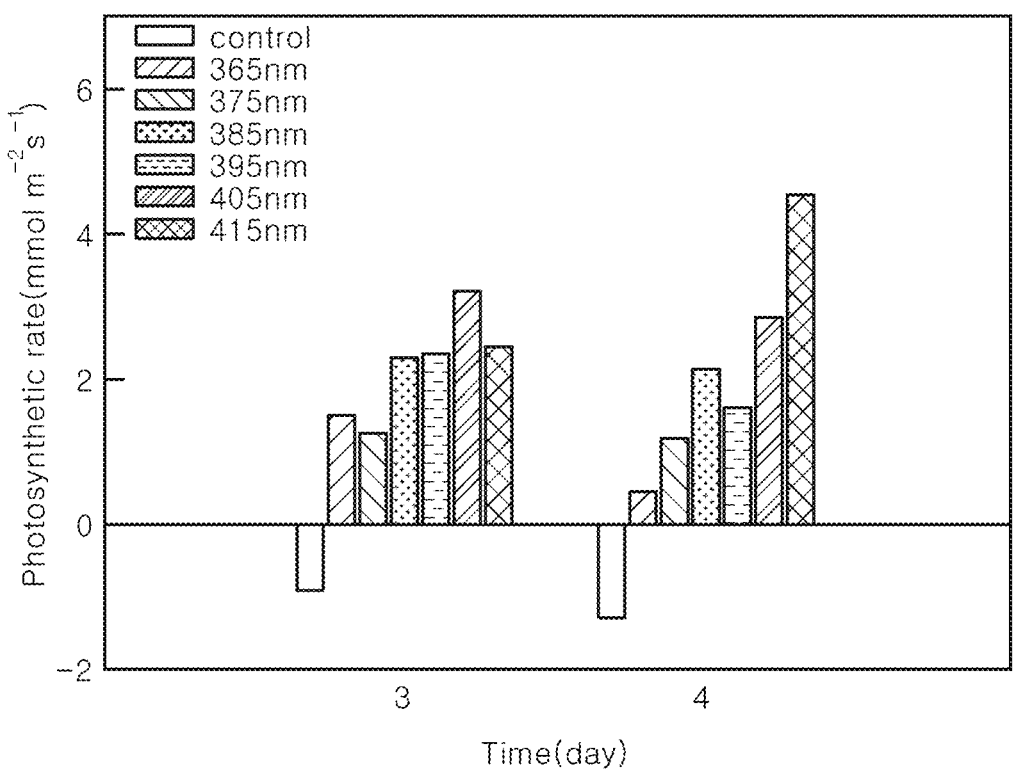
FIG. 12B is a graph depicting a photosynthesis rate measured for a night on days 3 and 4.

FIG. 12B is a graph depicting a photosynthesis rate measured for a night on days 3 and 4.

Referring to FIG. 12B, it could be ascertained that, during night time on days 3 and 4, the Control group did not perform photosynthesis, whereas all of the Treatment groups performed photosynthesis and the photosynthesis rate thereof also tended to increase with increasing wavelength. It could be ascertained that, on day 3, there was a significant difference between the Control group and the Treatment groups marked as 395 nm to 415 nm, and on day 4, the Treatment groups excluding the Treatment group marked as 365 nm exhibited a significant difference with the Control group.

In light of this result, it was determined that treatment with the second type of light did not provide any detrimental effect on photosynthesis of kale or provided an effect of enhancing photosynthesis both for day and night. This result shows the same tendency as in measurement of the dry weight and the fresh weight in Experimental Example 3 described above Accordingly, this result indicates that treatment with the second type of light induced the grown enhancement effect through the increase of the photosynthesis rate.

Experimental Example 7: Analysis of Stress Index after Irradiation with Light

1. Measurement of Image Chlorophyll Fluorescence (Fv/Fm)

Image chlorophyll fluorescence (Fv/Fm, maximum quantum yield) of the entire leaves of a plant was measured in order to indirectly determine whether treatment with the second type of light causes stress to the plant. Since dark adaptation of the plant must be allowed to calculate an Fv/Fm parameter through irradiation with saturation pulses, kale was placed under dark conditions for 30 minutes or more. Then, the maximum quantum value (Fm) and the minimum quantum value (Fo) were measured, and light pulse and intensity greater than or equal to saturation points were set to 20 kHz and 1,100 $\mu molm^{-2}s^{-1}$. The maximum quantum yield (Fv/Fm) was calculated according to Equation: Fv/Fm=(Fm−Fo)/Fm.

Figure 13:
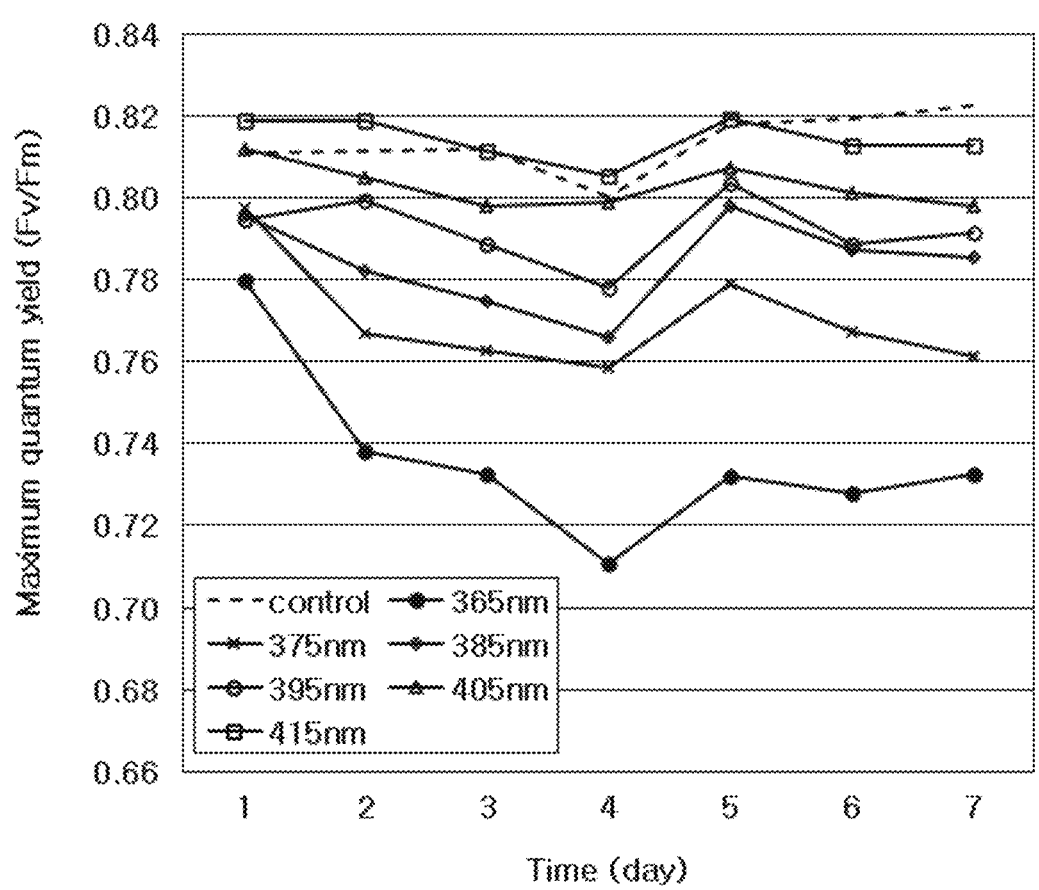
FIG. 13 is a graph depicting variation in maximum quantum yield for a week.

FIG. 13 is a graph depicting variation in maximum quantum yield for a week.

Referring to FIG. 13, it was ascertained that, although the Treatment groups had a maximum quantum yield (Fv/Fm) of 0.8 or less except for the Treatment groups marked as 405 nm and 415 nm, which had a maximum quantum yield of 0.8 or more, there was no significant difference with the Control group.

Figure 14A:
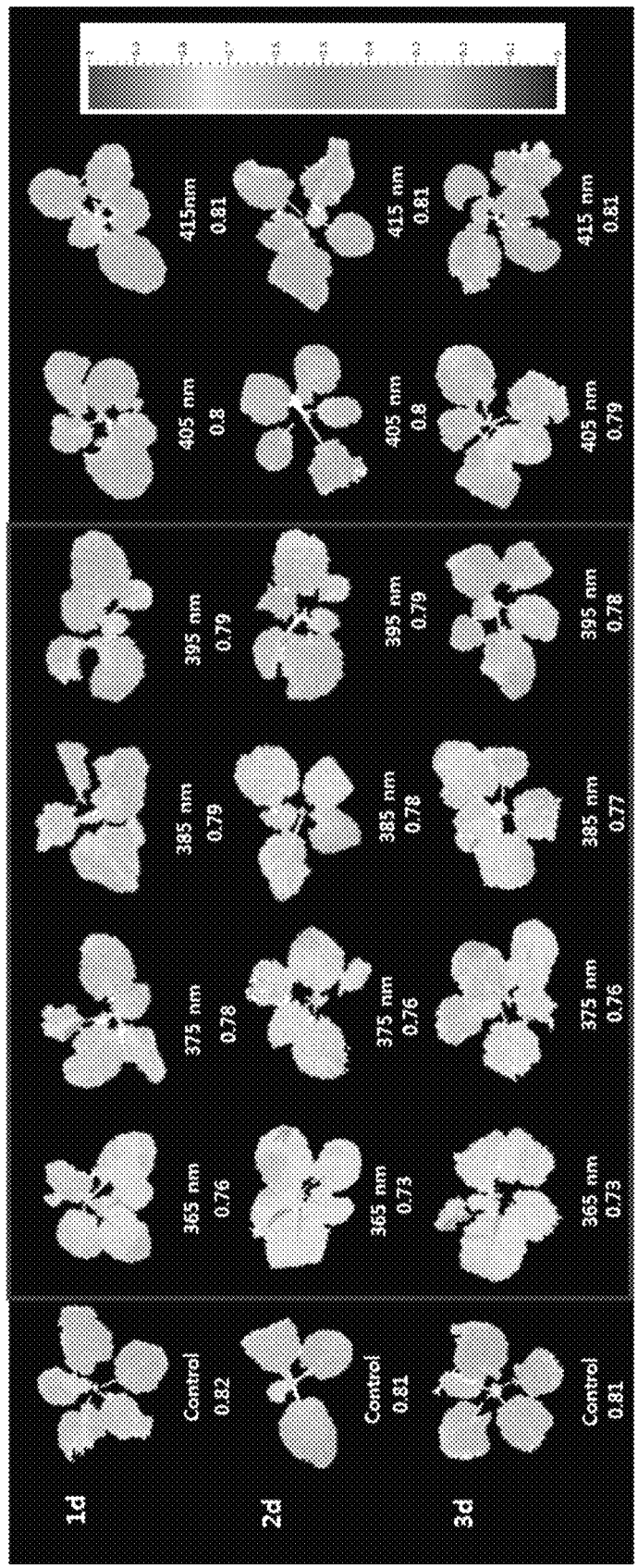
FIG. 14A shows chlorophyll fluorescence images of Treatment groups 1 to 6, measured under different treatment conditions for 7 days.
Figure 14B:
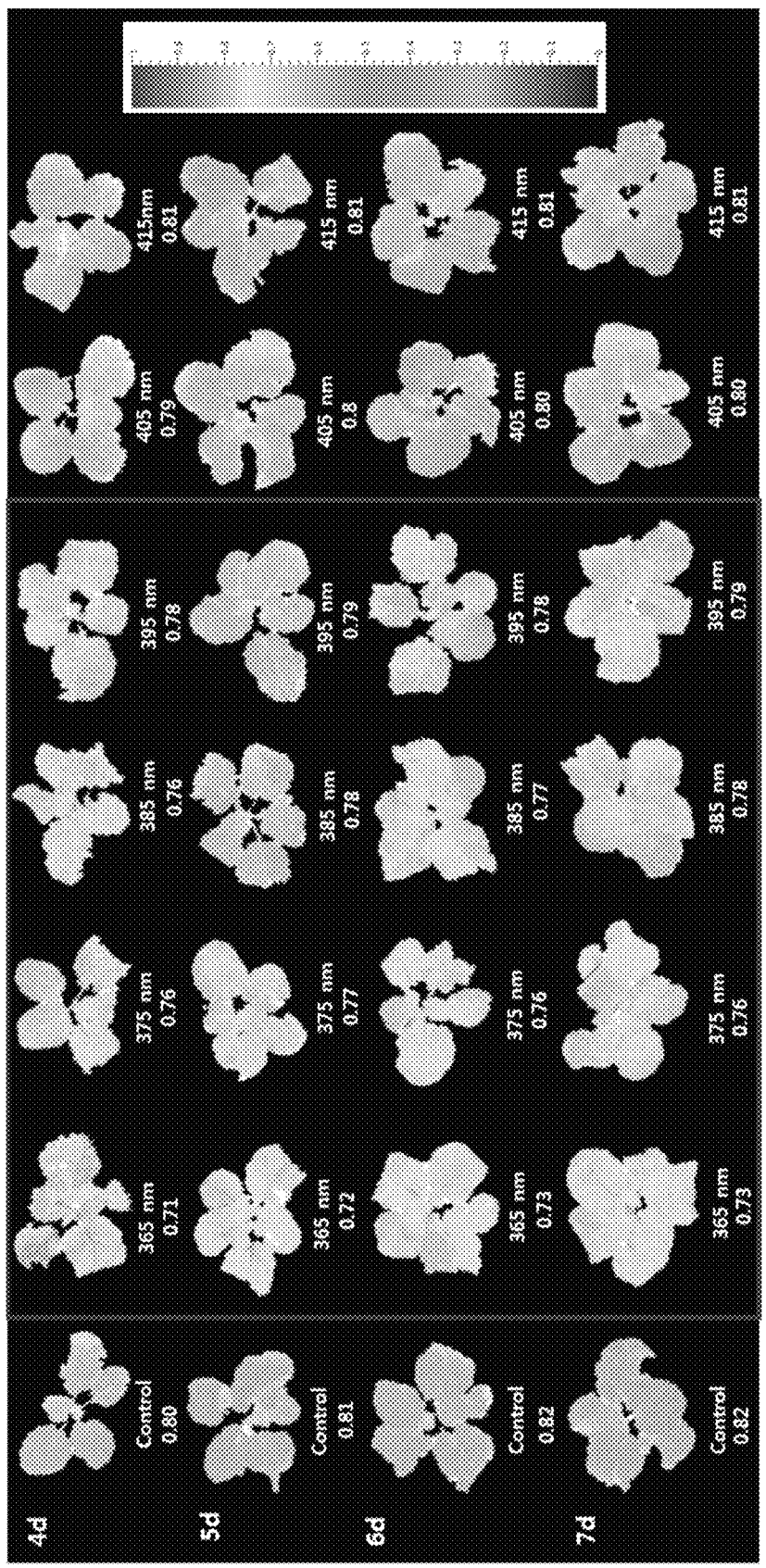
FIG. 14B shows chlorophyll fluorescence images of a Control group, measured under different treatment conditions for 7 days.

FIG. 14A and FIG. 14B show chlorophyll fluorescence images measured under different treatment conditions for 7 days, that is, Treatment groups 1 to 6 and Control group.

Referring to FIG. 14A and FIG. 14B, a chlorophyll fluorescence of 0.8 or more indicates that the plant has not been stressed, and all of the UVA Treatment groups except for the violet Treatment groups and the Control groups had a chlorophyll fluorescence of 0.8 or less. As a result, it could be ascertained that shorter wavelengths for the Treatment groups provided higher energy, thereby causing a higher stress index to the plant.

2. Measurement of Chl a/b

Figure 15:
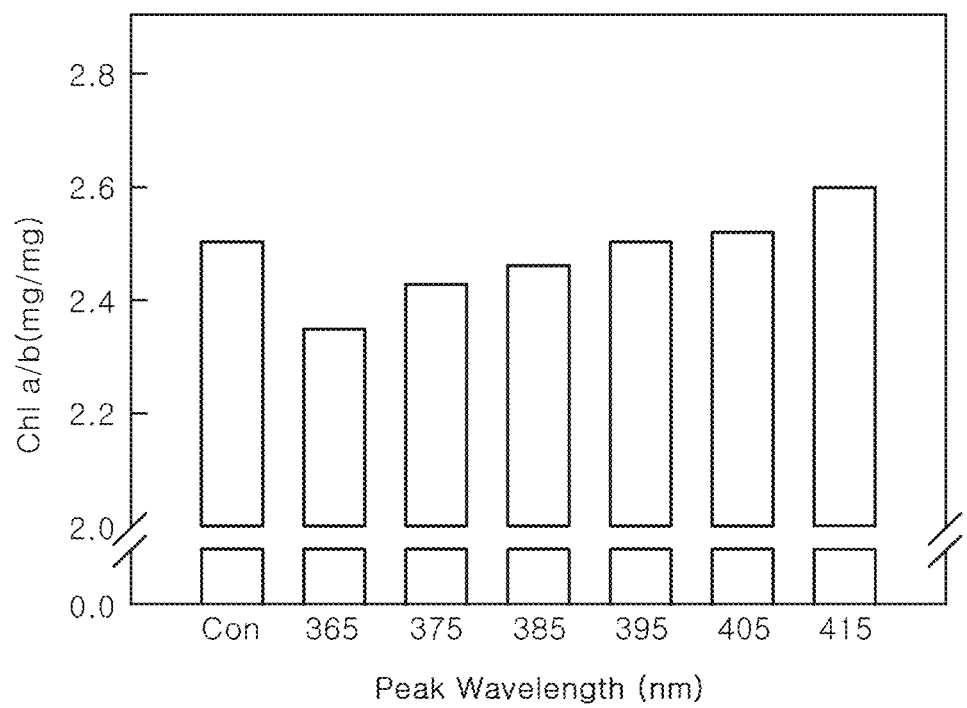
FIG. 15 is a graph of a measurement result of chlorophyll a/b on day 7.

FIG. 15 is a graph of a measurement result of chlorophyll a/b on day 7.

Referring to FIG. 15, the Chl (chlorophyll) a/b value increased as the peak wavelength of light increases. Chlorophyll a is a primary pigment which absorbs light energy required for photosynthesis. Chlorophyll b is an accessory pigment which absorbs light energy required for photosynthesis. Here, a high chlorophyll b value indicates that stress applied to the plant is high and the Chl a/b value decreases as b value increases. Accordingly, it is determined that, since the Chl a/b value tended to increase with the increasing wavelength of the Treatment groups on day 7, the chlorophyll b value decreases, thereby indicating that stress applied to the plant was decreased. Here, although Treatment groups 1 to 3 had relatively small Chl a/b values, which indicates that stress applied to the plant was higher in Treatment groups 1 to 3 than in the Control group, it is determined that there was no significant difference excluding Treatment group 1.

3. Measurement of Hydrogen Peroxide ($H_2O_2$)

In order to ascertain reliability of measurement of the image chlorophyll fluorescence and the Chl a/b performed in the experiment, the content of hydrogen peroxide ($H_2O_2$) was measured. Hydrogen peroxide ($H_2O_2$) is one of reactive oxygen species (ROS) in a plant and may be used as a stress index capable of evaluating whether the plant is subjected to stress. The content of hydrogen peroxide ($H_2O_2$) was analyzed using an EZ-Hydrogen peroxide/peroxidase assay kit (Oxidative Stress Assay Kit, DoGen Bion).

Figure 16:
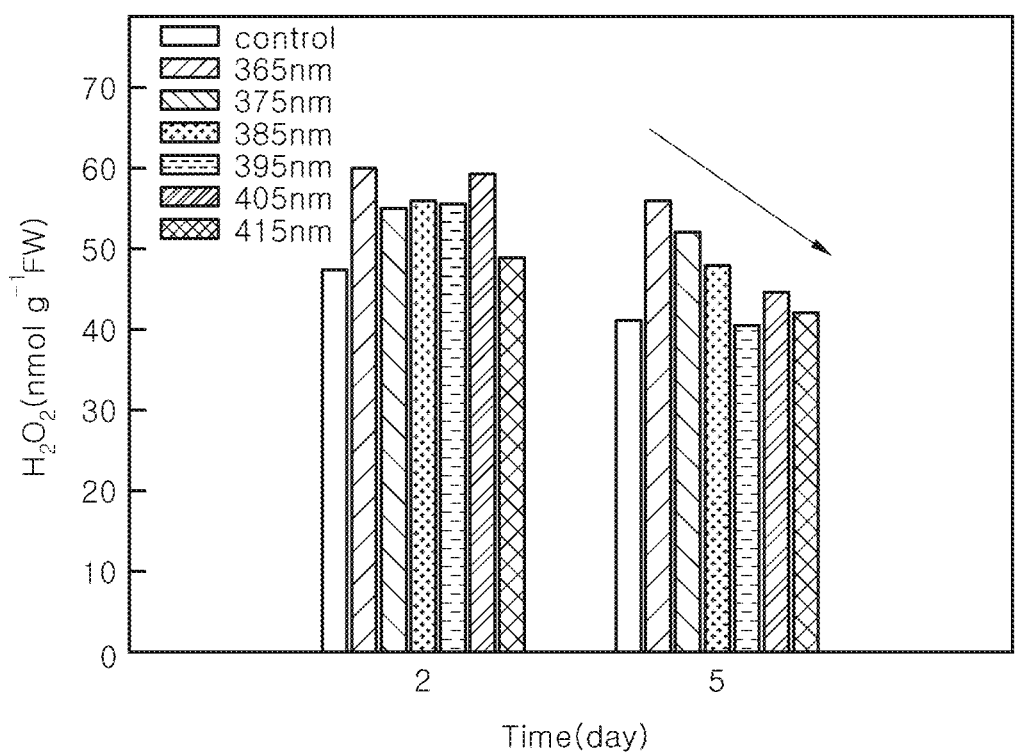
FIG. 16 is a graph depicting measurement results of the content of hydrogen peroxide on days 2 and 5.

FIG. 16 is a graph depicting measurement results of the content of hydrogen peroxide on days 2 and 5.

Referring to FIG. 16, it could be ascertained that, although there was no significant difference in the content of hydrogen peroxide ($H_2O_2$) between the Control group and the Treatment groups on days 2 and 5, the content of hydrogen peroxide ($H_2O_2$) increased with decreasing wavelength in the Treatment groups on day 5.

Comparing with the result graph of Experimental Example 7, it was ascertained that the Treatment group marked as 365 nm, in which the maximum quantum yield (Fv/Fm) was the lowest, that is, the plant experienced the greatest stress, had the highest content of hydrogen peroxide ($H_2O_2$) and the lowest Chl a/b value. That is, it is determined that the irradiation intensity increased with the decreasing wavelength of the Treatment groups, causing increased stress applied to the plant.

Experimental Example 8: Measurement of Phytochemicals Content after Irradiation with Light 1. Purpose of Experiment Phenolic content per gram, phenolic content per plant, antioxidant capacity per gram, and antioxidant capacity per plant were measured in order to ascertain a difference in production of phytochemicals between the treatment conditions in Experimental Example 3. Here, the phenolic content and antioxidant capacity are parameters for measurement of increase in beneficial secondary metabolites in kale upon treatment with the second type of light.

2. Experimental Method

On four weeks after planting kale, the aerial part was harvested and freeze-dried at −75° C. for about 72 hours, followed by pulverization for 3 minutes at about 15,000 rpm using a mill, thereby obtaining a powder sample for analysis. 40 mg of the powder sample was used and 80% acetone was added to 4 ml of the sample, followed by extraction using ultrasound.

(1) Measurement of Total Phenolic Content

An extracted solution was left at 4° C. for 12 hours and subjected to centrifugation at 3,000×g for 2 min to obtain a supernatant fluid, which in turn was used for analysis in unit of GAE mg/g DW. After reaction with analysis specimens, 1 ml of a sample was extracted and measured at about 765 nm using a spectrophotometer. As a standard fluid, gallic acid was used.

(2) Measurement of Antioxidant Capacity

An extracted solution was left at −20° C. for 12 hours and subjected to centrifugation to obtain a supernatant fluid, to which 80% acetone was added and diluted about 10 times. Thereafter, an antioxidant capacity measurement solution (2,2'-azino-bis(3-ethylbenzothiazoline-6-sulphonic acid, ABTS) was mixed with 5 mM of phosphate buffered saline (PBS) to meet an absorbance of 0.7±0.05. An absorbance of 0.7±0.05 was recorded before measurement of antioxidant capacity and 100 μL of the supernatant fluid was added to the mixture and vortexed for 1 minute, followed by measuring and recording the absorbance. The absorbance was measured at 730 nm.

3. Experiment Result

Figure 17B:
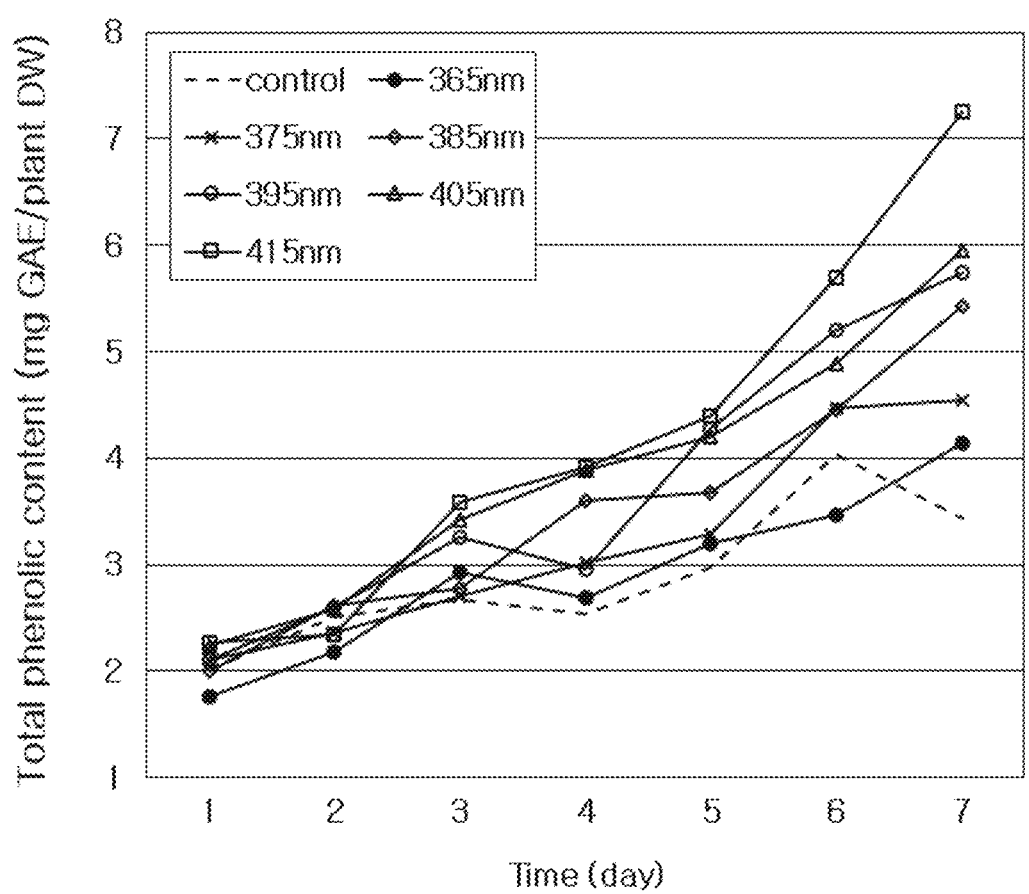

FIG. 17A is a graph depicting a phenolic content per gram of plant in dry weight and FIG. 17B is a graph depicting a phenolic content per plant.

Referring to FIG. 17A and FIG. 17B, it was ascertained that there was no significant difference in the total phenolic content per gram between all of the Treatment groups and the Control group. Here, it was ascertained that, from day 4, the total phenolic content per plant increased with the increasing wavelength in the Treatment groups and, on day 7, the Treatment groups marked as 385 nm to 415 nm exhibited a significant difference with the Control group through increase in total phenolic content.

Figure 18A:
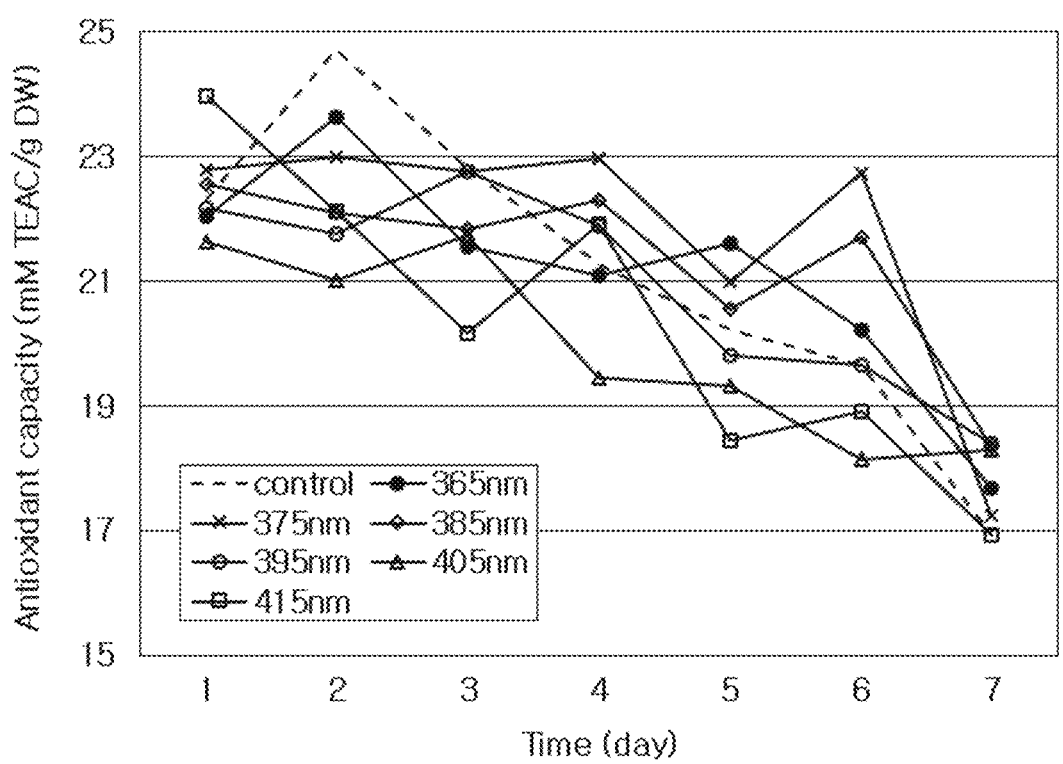
FIG. 18A is a graph depicting antioxidant capacity per gram of plant in dry weight and FIG. 18B is a graph depicting antioxidant capacity per plant.

FIG. 18A is a graph depicting antioxidant capacity per gram of plant in dry weight and FIG. 18A is a graph depicting antioxidant capacity per plant.

Figure 18B:
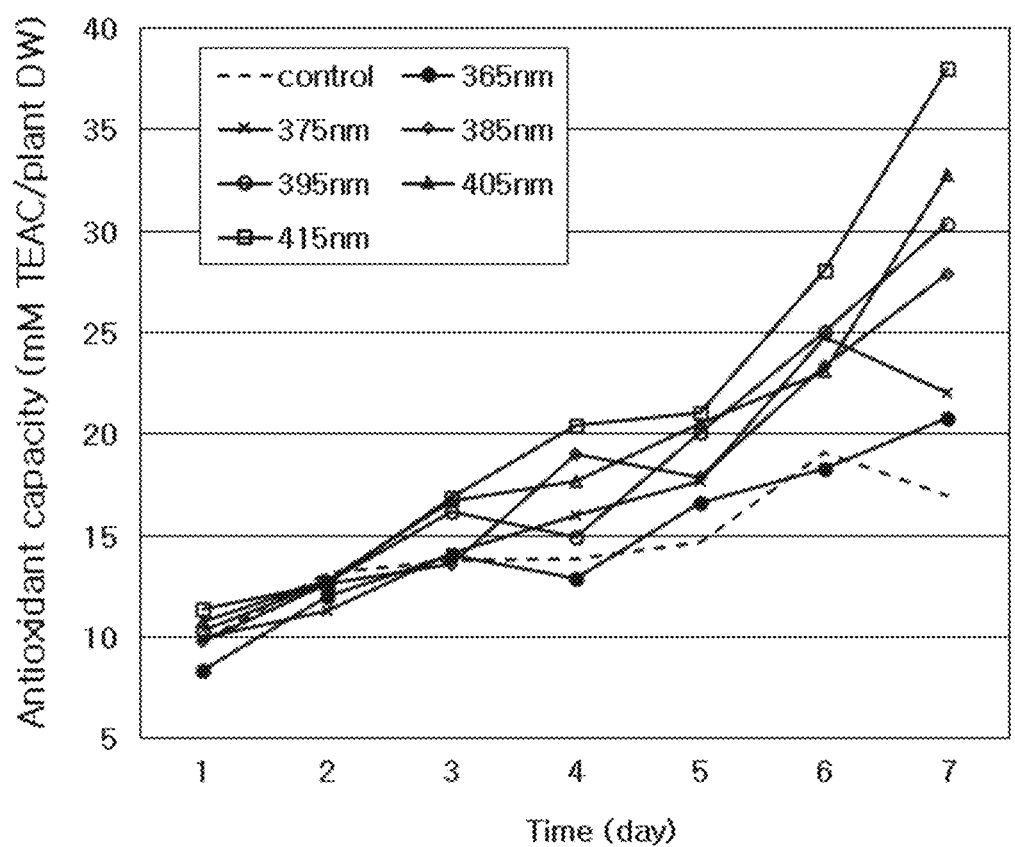

Referring to FIG. 18A and FIG. 18B, it could be ascertained that the antioxidant capacity per gram of the plant in dry weight is greater with the decreasing wavelength on days 5 and 6. The antioxidant capacity per plant exhibited a similar tendency to the total phenolic content. It was ascertained that, from day 4, the antioxidant capacity increased as the increasing wavelength and, on day 7, the Treatment groups marked as 385 nm to 415 nm exhibited a significant difference with the Control group through the increase in antioxidant capacity.

As a result, as compared with the Control group, the Treatment groups subjected to treatment with the second type of light achieved improvement in production of the phytochemicals. In particular, it could be seen that the production amount of the phytochemicals increased with increasing wavelengths in the Treatment groups. Furthermore, in this embodiment, considering that the phenolic content and antioxidant capacity per gram are different from the phenolic content and antioxidant capacity per plant, respectively, the production amount of the phytochemicals per gram can be higher despite a small size of a plant entity. That is, since more plant entities can be harvested in a small area, a plant entity having a small size and containing a high content of phytochemicals allows easier production of the phytochemicals than plant entities having a large size.

Experimental Example 7: Analysis of Phenylalanine Ammonia-Lyase (PAL) Activity

In order to more directly ascertain whether phytochemicals are actually produced in a plant through treatment with the second type of light, phenylalanine ammonia-lyase (PAL) activity was measured.

After treatment of the third leaf of a plant from the ground, 0.5 g of the leaf was collected on days 2 and 5. After pulverization of the leaf, the pulverized powder was mixed with 10 mL of a 25 mM, pH 8.8 borate buffer and 2 mL of 3 mM β-mercaptoethanol. 1.5 mL of the solution was extracted and subjected to centrifugation at 900×g for 20 min to obtain a supernatant fluid. Then, 0.5 mL of the supernatant fluid was mixed with 2.5 mL of a 10 mM, pH 8.8 borate buffer and 10 mM 1-phenylalanine at 40° C. for 2 hours. 100 μL of 5N HCl was added to the mixture to complete reaction, followed by measuring absorbance at 290 nm using a spectrophotometer.

Figure 19:
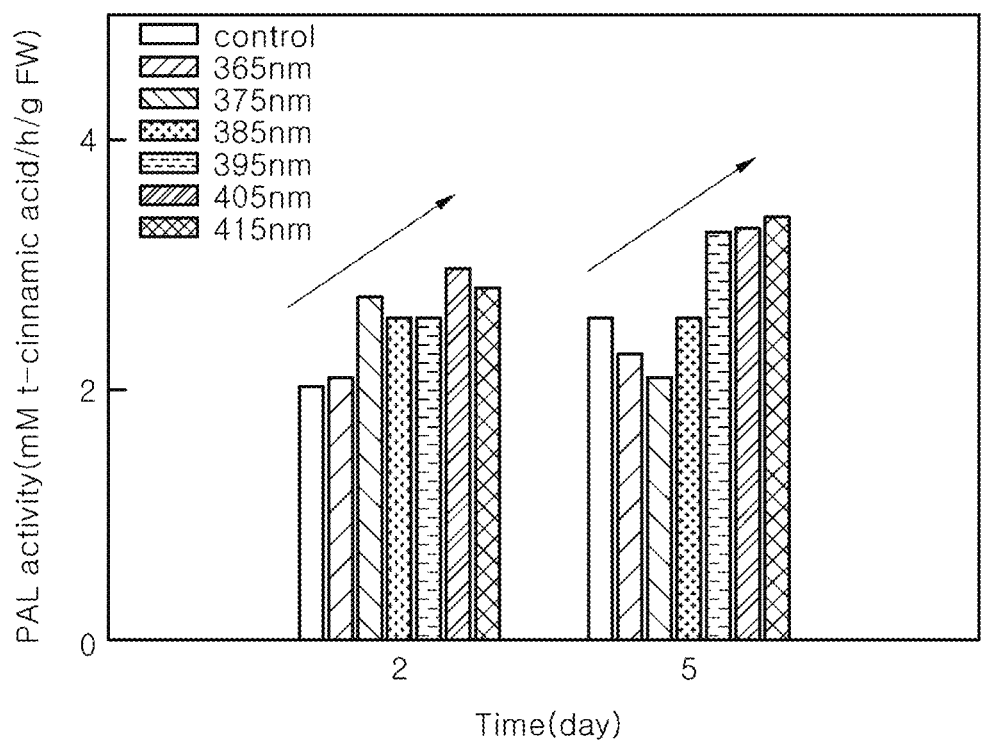
FIG. 19 is a graph depicting measurement results of phenylalanine ammonia-lyase activity on days 2 and 5.

FIG. 19 is a graph depicting measurement results of phenylalanine ammonia-lyase activity on days 2 and 5.

Referring to FIG. 19, although there was no significant difference in phenylalanine ammonia-lyase (PAL) activity between the Treatment groups and the Control group on days 2 and 5, the PAL activity increased with increasing wavelength in the Treatment groups. Comparing with the graph depicting the total phenolic content per plant in dry weight in Experimental Example 8, it could be seen that the PAL activity exhibited similar tendency thereto.

Evaluation

In the above experiments, despite generation of stress in cultivation of kale, treatment with the second type of light did not provide any detrimental effect on growth of kale, or rather exhibited similar growth to the Control group or further improvement in growth, as compared with the Control group in which treatment with the second type of light was not performed.

Further, it could be seen that growth of the plant and production of secondary metabolites (total phenolic content, antioxidant capacity) in the plant were further improved with the increasing wavelength in the Treatment groups. Particularly, it was ascertained that such improvement was more clearly exhibited in kale irradiated with a second type of light having a wavelength of 405 nm or 415 nm than kale irradiated with a second type of light having a wavelength of 365 nm to 395 nm, in terms of both growth and production of secondary metabolites.

With this result, it could be seen that treatment with the second type of light having a wavelength of 405 nm or 415 nm above 400 nm improved growth of crops and production of secondary metabolites without causing stress on the crops.

<Utilization of Light Source According to One Embodiment>

The light source for plant cultivation according to the embodiment of the present disclosure may be used in a plant factory, a plant cultivation apparatus, a greenhouse, and the like.

Figure 20:
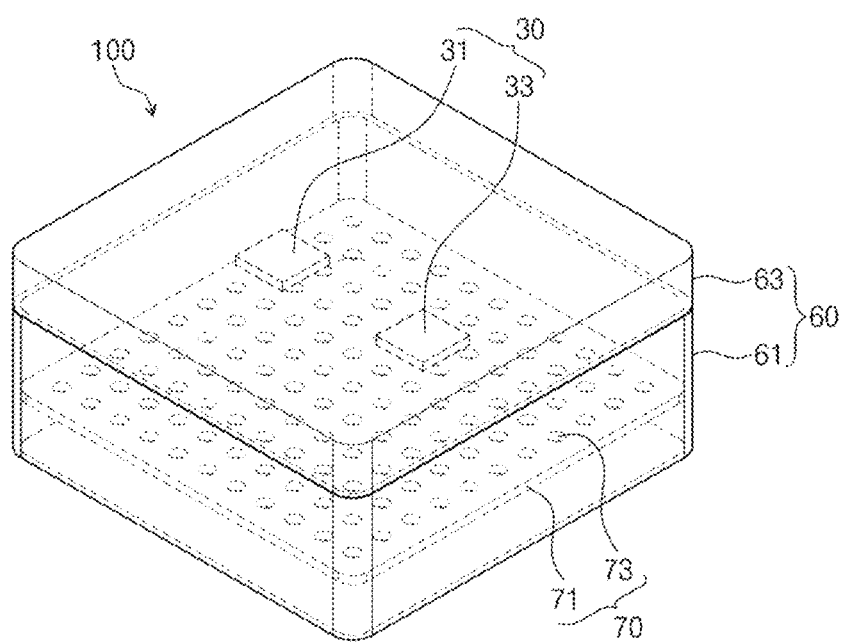
FIG. 20 is a schematic view of a cultivation apparatus according to one embodiment of the present disclosure.

FIG. 20 is a schematic view of a plant cultivation apparatus according to one embodiment of the present disclosure.

The plant cultivation apparatus shown in FIG. 20 may be implemented as a small-scale cultivation apparatus, without being limited thereto. Although the plant cultivation apparatus according to this embodiment may be implemented as a large-scale cultivation apparatus used in a plant factory, the present disclosure will be described by way of example with reference to a structure in which the plant cultivation apparatus is implemented as a small-scale cultivation apparatus.

Referring to FIG. 20, the plant cultivation apparatus 100 according to the embodiment includes a housing 60 having an inner space for growing a plant and a light source 30 disposed in the housing 60.

The housing 60 provides an empty space in which the plant is placed and grown. The housing 60 is provided in the form of a box that can block out external light. In one embodiment, the housing 60 may include a lower case 61 open upwards and an upper case 63 open downwards. The lower case 61 and the upper case 63 may be fastened to each other to form a box that blocks out external light.

The lower case 61 includes a bottom and a sidewall extending upwards from the bottom. The upper case 63 includes a cover and a sidewall extending downwards from the cover. The sidewalls of the lower case 61 and the upper case 63 may be engaged with each other. The lower case 61 and the upper case 63 may be fastened to or separated from each other, as desired by a user. Accordingly, the user can open or close the housing 60, as needed.

The housing 60 may have various shapes. For example, the housing 60 may have a generally cuboidal shape or a cylindrical shape. However, it will be understood that the present disclosure is not limited thereto and the housing 60 may have various other shapes.

The housing 60 provides an environment for growth of the plant placed therein. The housing 60 may be sized to allow multiple plants to be placed and grown therein. The size of the housing 60 may vary depending on applications of the plant cultivation apparatus 100. For example, when the plant cultivation apparatus 100 is used for small-scale home cultivation, the housing 60 may have a relatively small size. When the plant cultivation apparatus 100 is used for large-scale commercial cultivation, the housing 60 may have a relatively large size.

In one embodiment, the housing 60 may block external light from entering the housing 60. Thus, the housing 60 may provide a dark environment isolated from the outside. In this way, it is possible to prevent external light from unnecessarily reaching the plant placed inside the housing 60. In particular, the main body 100 can prevent external visible light from reaching the plant. However, in some embodiments, the housing 60 may be partially open to receive external light.

In this embodiment, the inner space of the housing 60 may be an undivided space. However, this structure is merely for convenience of description and the housing 60 may be divided into multiple compartments. That is, the housing 60 may be provided with multiple partitions dividing the inner space of the housing 60 into multiple compartments.

The light source supplies light to the plant inside the housing 60. in some forms, the light source may be disposed on an inner surface of the upper case 63 or the lower case 61. In other forms, the light source may be disposed on the cover of the upper case 63. Although the light source is illustrated as being disposed on an inner surface of the cover of the upper case 63, it will be understood that the present disclosure is not limited thereto. In another embodiment, the light source may be disposed on the sidewall of the upper case 63. In another form, the light source may be disposed on the sidewall of the lower case 61, for example, at an upper end of the sidewall of the lower case 61. In yet another form, the light source may be disposed on at least one selected from among the cover of the upper case 63, the side wall of the upper case 63, and the side wall of the lower case 61.

The housing 60 may be provided in the inner space thereof with a cultivation table 70 to facilitate plant cultivation, for example, hydroponics. The cultivation table 70 may include a plate 71 disposed at a distance above the bottom of the housing 60. The plate 71 may be formed with a through-hole 73 having a predetermined size. The cultivation table 70 is adapted to place the plant on an upper surface of plate 71 of the plate 71 and may have multiple through-holes 73 through which a remaining portion of supplied water is discharged from the cultivation table. Each of the through-holes 73 may be sized to prevent the plant from being washed away therethrough. For example, each of the through-holes 73 may have a smaller diameter than the plant. A space between the cultivation table 70 and the bottom of the lower case 61 may serve as a water tank. Accordingly, the water discharged downwards through the through-holes 73 of the cultivation table 70 may be stored in the space between the bottom of the lower case 61 and the cultivation table 70.

According to one embodiment, cruciferous plants may be cultivated by methods other than hydroponics. In this embodiment, the housing 60 may be provided in the inner space thereof with water, a culture medium, soil, and the like such that water and/or nutrients can be sufficiently supplied to the cruciferous plants. Here, the housing 60 serves as a container. The culture medium or soil may contain nutrients necessary for growth of the plant, for example, potassium (K), calcium (Ca), magnesium (Mg), sodium (Na), and iron (Fe). Depending on the type of plant cultivated, the plant may be buried in the culture medium or may be placed on a surface of the culture medium.

The size and shape of the cultivation table 70 may vary depending on the shape of the housing 60 and the types of first and second light sources. The cultivation table 70 may be sized and shaped to be located within the illumination range of the first light source and the second light source.

The housing 60 may be provided therein with a water supply device (not shown) supplying water to the plant. The water supply device may be disposed at an upper end of the housing 60, for example, on the inner surface of the cover of the upper case 63 and may be provided in a form suitable for spraying water onto the cultivation table 70 in the housing 60. However, it will be understood that the present disclosure is not limited thereto and the water supply device may be provided in various forms depending on the shape of the housing 60 and the arrangement of the cultivation table 70. Alternatively, a user may directly supply water into the housing 60 without any separate water supply device.

One or more water supply device may be provided. The number of water supply devices may vary depending on the size of the housing. For a relatively small household plant cultivation apparatus, one water supply unit may be provided since the housing is relatively small. On the contrary, for a relatively large commercial plant cultivation apparatus, several water supply devices may be provided since the housing is relatively large. However, it will be understood that the present disclosure is not limited thereto and any suitable number of water supply devices may be disposed at any suitable positions.

The water supply device may be connected to a water tank inside the housing 60 or a water supply outside the housing 60. In addition, the water supply device may further include a filter filtering out pollutants from water to be supplied to the plant. The filter may include, for example, an activated carbon filter and a non-woven fabric filter. Thus, water having passed through the filter can be free from impurities. The filter may further include a lamp-type filter, as needed. The lamp-type filter irradiates water with UV light or the like to remove germs, bacteria, mold spores, and the like from the water. With these filters of the water supply device, the plant cultivation apparatus according to the present disclosure can prevent contamination of the interior of the housing 60 and the plant inside the housing 60 even when water discharged from the cultivation table is recycled or when rainwater is directly used for cultivation.

Although water supplied from the water supply device may be water free from additional nutrients (for example, purified water), it will be understood that the present disclosure is not limited thereto and water may contain nutrients necessary for growth of the plant. For example, water may contain metals, such as potassium (K), calcium (Ca), magnesium (Mg), sodium (Na), and iron (Fe), nitrates, phosphates, sulfates, and chlorides. For example, Sachs's solution, Knop's solution, Hoagland's solution, Hewitt's solution, and the like may be supplied from the water supply device.

According to one embodiment, a plant may be grown using the light source set force above.

A plant cultivation method according to one embodiment may include germinating seeds of a plant and supplying at least one type of light to the germinated seeds.

According to one embodiment, there is provided a plant cultivation method using a light source for plant cultivation adapted to emit light to a plant. The light source for plant cultivation includes a first light source emitting a first type of light for photosynthesis and a second light source emitting a second type of light comprising blue light, purple light or UVA., The second type of light has a peak in the wavelength band of about 360 nm to about 420 nm.

In one embodiment, each of the first light source and the second light source has a photo-period consisting of a light period and a dark period, in which the first type of light is emitted for the light period and the second type of light is continuously emitted in the light period and the dark period for 1 week after two weeks from planting of the plant.

In one embodiment, the content of phytochemicals in the plant may be adjusted by irradiating the plant with the first type of light and the second type of light.

Although some embodiments have been described herein, it should be understood that various modifications, changes, alterations, and equivalent embodiments can be made by those skilled in the art without departing from the spirit and scope of the present disclosure. Therefore, it should be understood that these embodiments are provided for illustration only and are not to be construed in any way as limiting the present disclosure.

Therefore, the scope of the present disclosure should be defined by the appended claims and equivalents thereto.

What is claimed is:

1. A light source for plant cultivation adapted to emit light to a plant, the light source comprising:
   a first light source configured to emit a first type of light for photosynthesis of the plant, the first type of light having at least two peaks in the visible spectrum; and
   a second light source, the second light source being a phytochemical adjustment light source that is configured to emit a second type of light for adjustment of phytochemicals in the plant, the second type of light having a third peak in a different wavelength band from the at least two peaks of the first type of light,
   a controller configured to control the first light source and the second light source such that
   the third peak of the phytochemical adjustment light source is in the wavelength band of 360 nm to 420 nm,
   an intensity of the first type of light at a first peak is consistently less than half the intensity of the phytochemical adjustment light source at the third peak,
   the third peak is a highest peak of the second type of light, and
   in the first peak is a second highest peak of the first type of light and is in the wavelength band of 420 nm to 500 nm.

2. The light source for plant cultivation according to claim 1, wherein the second type of light is ultraviolet light, purple light or blue light.

3. The light source for plant cultivation according to claim 2, wherein the second type of light has a peak in the wavelength band of 400 nm to 420 nm.

4. The light source for plant cultivation according to claim 1, wherein the at least two peaks of the first type of light are in the wavelength band of –400 nm to 700 nm.

5. The light source for plant cultivation according to claim 1, wherein the first type of light corresponds to PAR (Photosynthetic Active Radiation).

6. The light source for plant cultivation according to claim 1, wherein the first light source emits light having a spectrum that spans the visible wavelength band.

7. The light source for plant cultivation according to claim 1, wherein an intensity of the first type of light at a second peak is consistently substantially the same as an intensity of the second type of light, wherein the second peak is in the wavelength band of 600 nm to 700 nm.

8. The light source for plant cultivation according to claim 1, wherein the first light source and the second light source are independently driven to be turned on or off.

9. The light source for plant cultivation according to claim 8, wherein each of the first light source and the second light source comprises:
 a first semiconductor layer doped with a first conductivity type dopant;
 a second semiconductor layer disposed on the first semiconductor layer and doped with a second conductivity type dopant different from the first conductivity type dopant; and
 an active layer interposed between the first semiconductor layer and the second semiconductor layer.

10. The light source for plant cultivation according to claim 1, wherein the first light source is turned on or off according to a photo-period consisting of a light period and a dark period.

11. The light source for plant cultivation according to claim 10, wherein the second type of light is emitted for a period of time at least partially overlapping the light period and the dark period.

12. The light source for plant cultivation according to claim 11, wherein the second type of light is continuously emitted.

13. The light source for plant cultivation according to claim 1, wherein the phytochemicals comprise at least one selected from among phenolic and antioxidant substances.

14. The light source for plant cultivation according to claim 1, wherein the plant is a cruciferous plant.

15. The light source for plant cultivation according to claim 14, wherein the cruciferous plant comprises at least one selected from among kale, broccoli, cabbage, Chinese cabbage, shepherd's purse, bok choy, oilseed rape, radish, and mustard.

16. A plant cultivation method using a light source for plant cultivation adapted to emit light to a plant, the light source for plant cultivation comprising:
 a first light source emitting a first type of light for photosynthesis of the plant, the first type of light having at least two peaks in the visible spectrum; and
 a second light source, the second light source being a phytochemical adjustment light source emitting a second type of light for adjustment of phytochemicals in the plant, the second type of light having a third peak in a different wavelength band from the at least two peaks of the first type of light,
 wherein the third peak of the phytochemical adjustment light source is in the wavelength band of 360 nm to 420 nm, an intensity of the first type of light at a first peak is consistently less than half the intensity of the phytochemical adjustment light source at the third peak, wherein the third peak is a highest peak of the second type of light, and wherein the first peak is a second highest peak of the first type of light and is in the wavelength band of 420 nm to 500 nm, and the content of phytochemicals in the plant is adjusted by irradiating the plant with the first type of light and the second type of light.

17. The plant cultivation method according to claim 16, wherein the second type of light has a peak in the wavelength band of 400 nm to 420 nm.

18. The plant cultivation method according to claim 17, wherein the first type of light has at least two peaks in the wavelength band of 380 nm to 780 nm and corresponds to PAR (Photosynthetic Active Radiation).

19. The plant cultivation method according to claim 16, wherein the first light source is turned on or off according to a photo-period consisting of a light period and a dark period.

20. The plant cultivation method according to claim 19, wherein the second type of light is emitted for a period of time at least partially overlapping the light period and the dark period.

* * * * *

UNITED STATES PATENT AND TRADEMARK OFFICE
CERTIFICATE OF CORRECTION

| | | |
|---|---|---|
| PATENT NO. | : 12,376,532 B2 | Page 1 of 1 |
| APPLICATION NO. | : 17/219367 | |
| DATED | : August 5, 2025 | |
| INVENTOR(S) | : Myung Min Oh and Da-seul Choi | |

It is certified that error appears in the above-identified patent and that said Letters Patent is hereby corrected as shown below:

In the Claims

In Claim 1, at Column 20, Line 62, "in the first peak" should read –the first peak–.

Signed and Sealed this
Second Day of September, 2025

Coke Morgan Stewart
*Acting Director of the United States Patent and Trademark Office*